United States Patent [19]

Temple

[11] Patent Number: 4,958,211
[45] Date of Patent: Sep. 18, 1990

[54] MCT PROVIDING TURN-OFF CONTROL OF ARBITRARILY LARGE CURRENTS

[75] Inventor: Victor A. Temple, Clifton Park, N.Y.

[73] Assignee: General Electric Company, Schenectady, N.Y.

[21] Appl. No.: 239,678

[22] Filed: Sep. 1, 1988

[51] Int. Cl.$^5$ .............................................. H01L 29/74
[52] U.S. Cl. ..................................... 357/38; 357/23.4; 357/39; 357/57
[58] Field of Search ...................... 357/38, 39, 57, 23.4

[56] References Cited

U.S. PATENT DOCUMENTS

| | | | |
|---|---|---|---|
| 4,261,001 | 4/1981 | Temple | 357/38 |
| 4,541,002 | 9/1985 | Shimada | 357/59 |
| 4,639,762 | 1/1987 | Neilson et al. | 357/38 |
| 4,672,407 | 6/1987 | Nakagawa et al. | 357/38 |
| 4,680,604 | 7/1987 | Nakagawa et al. | 357/38 |
| 4,717,940 | 1/1988 | Shinohe et al. | 357/38 |
| 4,782,372 | 11/1988 | Nakagawa et al. | 357/38 |

FOREIGN PATENT DOCUMENTS 3711033 10/1987 Fed. Rep. of Germany ..... 357/23.4

OTHER PUBLICATIONS

U.S. Patent Application entitled "Controlled Turn-On Thyristor", by V.A.K. Temple, Ser. No. 857,201, filed Apr. 29, 1986 as a continuation of Ser. No. 626,165, filed June 29, 1984, both now abandoned; application Ser. No. 119,283 filed Oct. 20, 1987 is a file wrapper continuation of Ser. No. 857,201.

Temple, Victor A. K., "Controlled Turn-On Thyristors", IEEE Transactions on Electron Devices, vol. ED-30, No. 7, Jul., 1983, pp. 816-824.

Primary Examiner—Rolf Hille
Assistant Examiner—Steven Loke
Attorney, Agent, or Firm—Robert Ochis; James C. Davis, Jr.; Marvin Snyder

[57] ABSTRACT

An MOS controlled thyristor (MCT) provides insulated gate control of turn-off from the regenerative state for arbitrarily large currents. An emitter region of the thyristor is provided with a high injection efficiency portion which is resistively connected to an ohmic contact to the main power electrode for that emitter region. The turn-off gate controls a channel region through that emitter region which connects a source region to the adjacent base region. During gate induced turn-off, the resistive connection of the high efficiency emitter region to the power electrode provides an additional voltage drop over that of a forward biased junction to encourage the flow of carriers through the channel region into the source region to bypass the emitting junction.

39 Claims, 21 Drawing Sheets

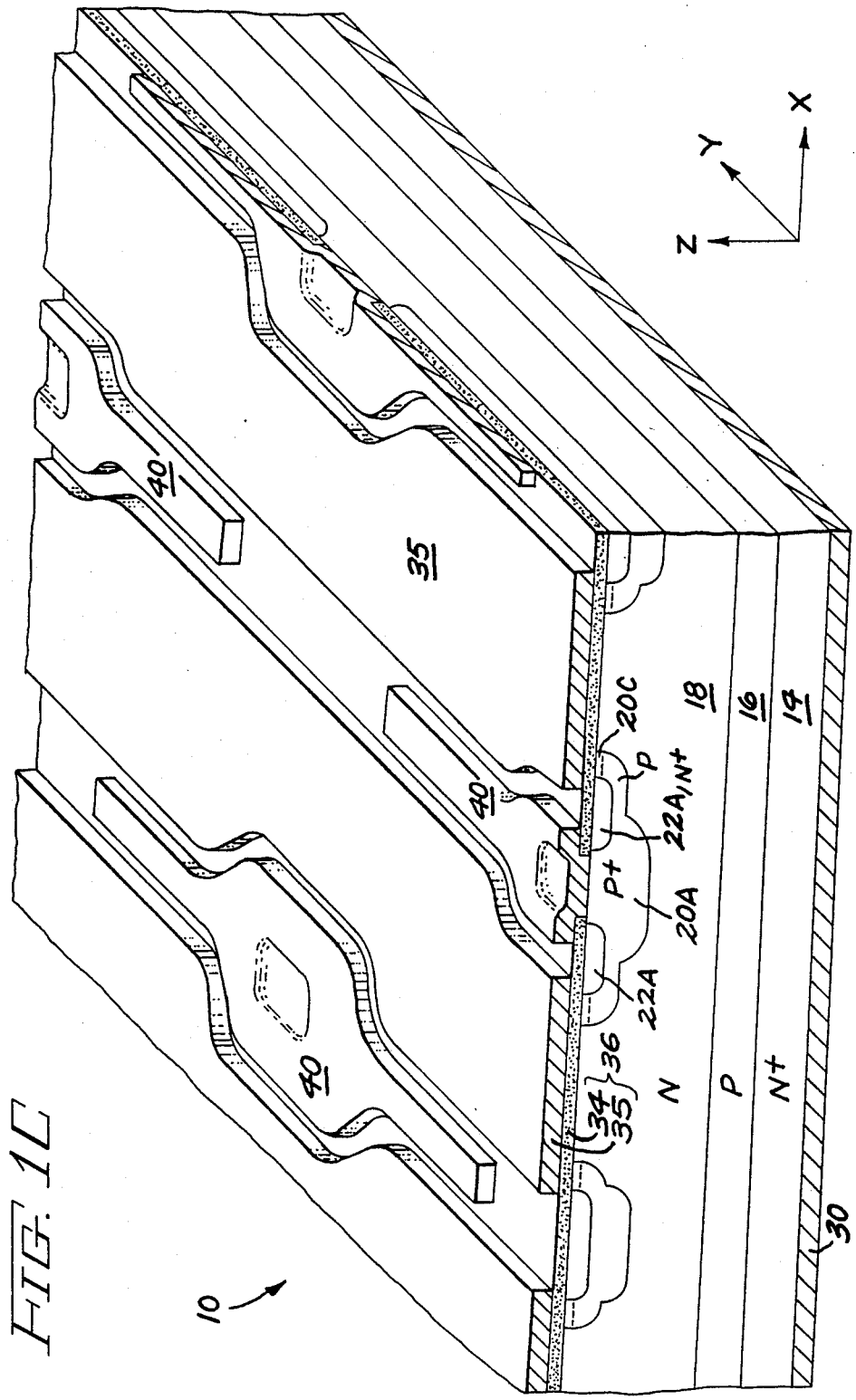

MCT PROVIDING TURN-OFF CONTROL OF ARBITRARILY LARGE CURRENTS

BACKGROUND OF THE INVENTION

1. Field of the Invention

The present invention relates to the field of thyristors, and more particularly, to the field of metal-oxide-semiconductor (MOS) controlled thyristors which are also known as MCTs.

2. Prior Art

Thyristors are four layer (NPNP) semiconductor devices which latch in a conducting state when their current exceeds a holding current and remain in a conductive state because of internal regenerative action until turned off by removal of the signal applied to their main electrodes or by application of a turn-off signal to an appropriately connected turn-off electrode.

Since thyristors are power devices which are intended to carry large currents, greater than 1 ampere, normally greater than 10 amperes and often more than 100 amperes, substantial effort has been expended in attempting to minimize all resistances between the external package leads in the main current paths of these devices. This effort has been variously directed to reducing contact resistances and the resistances of the portions of the current path which are disposed within the semiconductor body. To this end, the high injection efficiency (heavily doped) portions of the emitter regions are directly connected to the power electrodes via heavily doped portions of the emitter regions to minimize the resistance of the connections between the power electrodes and the injecting portions of the emitter/base junctions. It is also normal practice to minimize the maximum length of the current path between each power electrode and the portion of its associated emitter/base junction which is most remote from the power electrode. This aids in reducing ON-state resistance and in making current flow more uniform. The purpose of this effort has been to minimize the ON-state resistance in order to minimize the ON-state voltage drop and power dissipation in the device.

Early gate turn-off thyristors had a gate electrode in ohmic contact with one of the inner or base layers of the structure. This structure required that the gate draw from one-third to one-half of the ON-state current of the thyristor in order to turn off the thyristor's regenerative action. More recently, MOS controlled thyristors (MCTs) have been developed in which an insulated gate electrode functions as a turn-off gate while drawing miniscule gate current. Such MCTs are beneficial because of the low power levels required in the gate drive circuitry, but can be subject to a problem of conducting more current in their latched state than their MOS gate can turn off with the result that gate control is lost for such high currents.

Consequently, there is a need for an MCT structure which is capable of turning off arbitrarily large currents.

OBJECTS OF THE INVENTION

A primary object of the present invention is to provide an MCT structure which is capable of turning off arbitrarily large currents.

Another object is to provide an MCT structure whose maximum turn-off current is controlled by the geometry of the device regions.

Still another object is to provide an MCT structure in which the current turn-off capacity increases with increasing ON-state current.

A further object is to provide an MCT having an emitter region including two different portions exhibiting two different injection efficiencies.

SUMMARY OF THE INVENTION

The foregoing and other objects of the invention are achieved in an MCT comprising first and second emitter zones of different conductivity types spaced apart by intervening first and second base zones of different conductivity types and including a source region disposed within the second emitter region. An insulated gate electrode is disposed over the second emitter region to provide MOS control over the conductivity of a channel portion of the second emitter region extending between the source region and the second base region. This MOS structure comprises the turn-off FET of the MCT. The second emitter region includes a first, high doping concentration, high charge injection efficiency portion which is connected to the associated power electrode through a resistance or other impedance. The impedance connecting the high doping concentration, high efficiency portion of the second emitter region to the first power electrode is selected in accordance with the desired current turn-off capacity for the thyristor. It is preferred that the resistance have a value which is at least one-quarter the resistance of the turn-off FET. This provides a minimum increase in ON-state voltage drop at the nominal operating current level. A resistance equal to the resistance of the turn-off FET enables gate control to turn off arbitrarily large currents in the MCT. The greater the current flowing through the device, the greater the voltage drop through the impedance connecting the high efficiency portion of the second emitter region to the first power electrode. As a consequence, when a turn-off bias voltage is applied to the insulated gate electrode, the voltage difference between the second base region adjacent the high efficiency portion of the second emitter region and the contact to the source region increases in proportion to the excess of the current over the nominal value. This causes an increase in the current diversion capacity of the source-base (turn-off) MOS field effect structure with increasing ON-state current. Consequently, the larger the ON-state current, the greater is the turn-off capacity of the MOS structure.

The device may also include a relatively low doping concentration, low carrier injection efficiency portion in the second emitter region. This low injection efficiency portion of the emitter may be disposed in direct ohmic contact with the second power electrode since its low injection limits the regenerative feedback within that portion of the thyristor.

The less efficient portion of the second emitter region is preferably designed so that its injection efficiency is low enough to ensure that during turn-off of large currents, it is incapable, by itself, of sustaining regenerative action within the thyristor, thereby ensuring that the thyristor will turn off in response to a turn-off bias voltage applied to the insulated gate electrode.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 1A-1D are stylized perspective views of an MCT in accordance with the present invention with different layers or levels exposed;

DETAILED DESCRIPTION

Figure 1A:
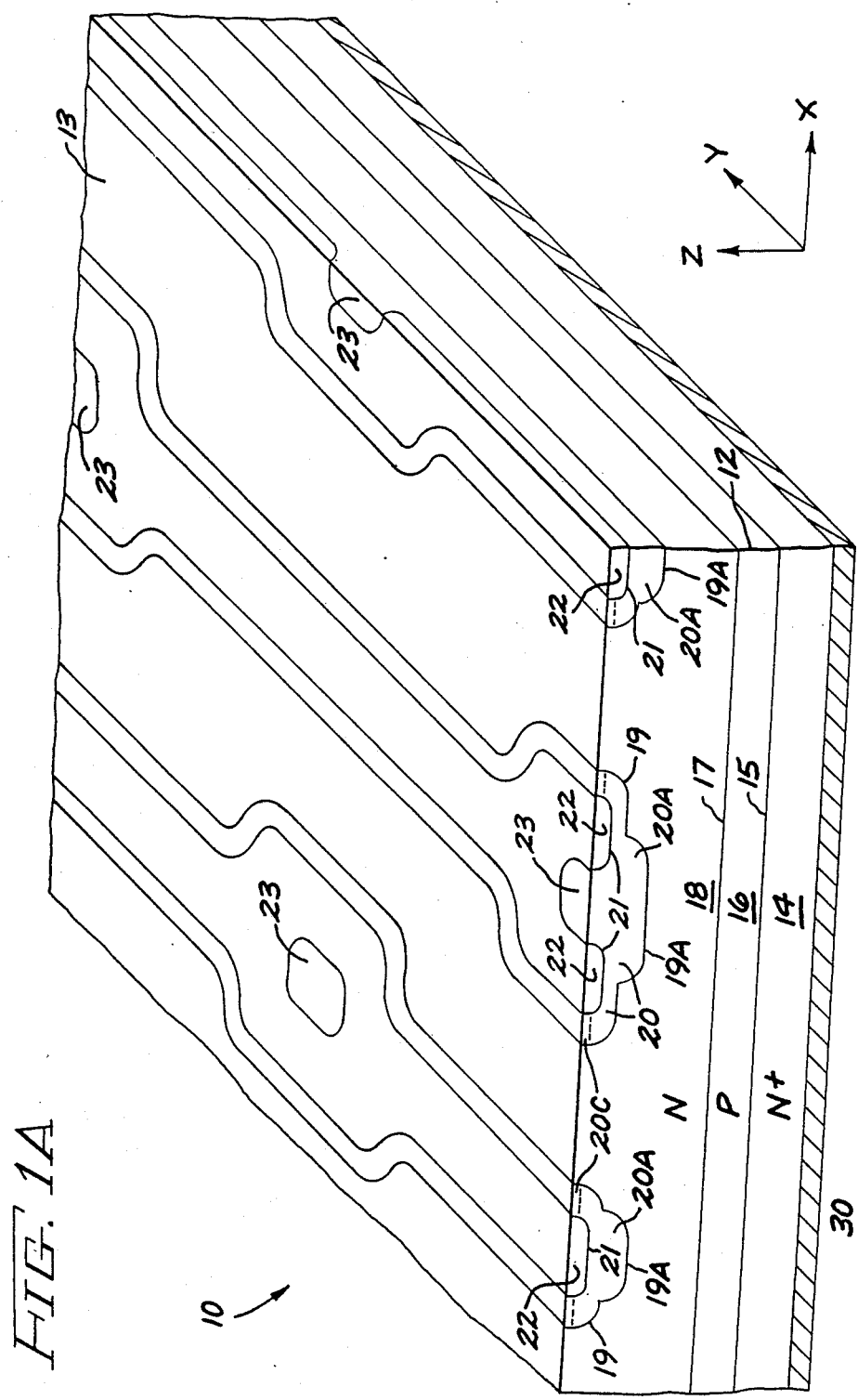
Figure 1B:
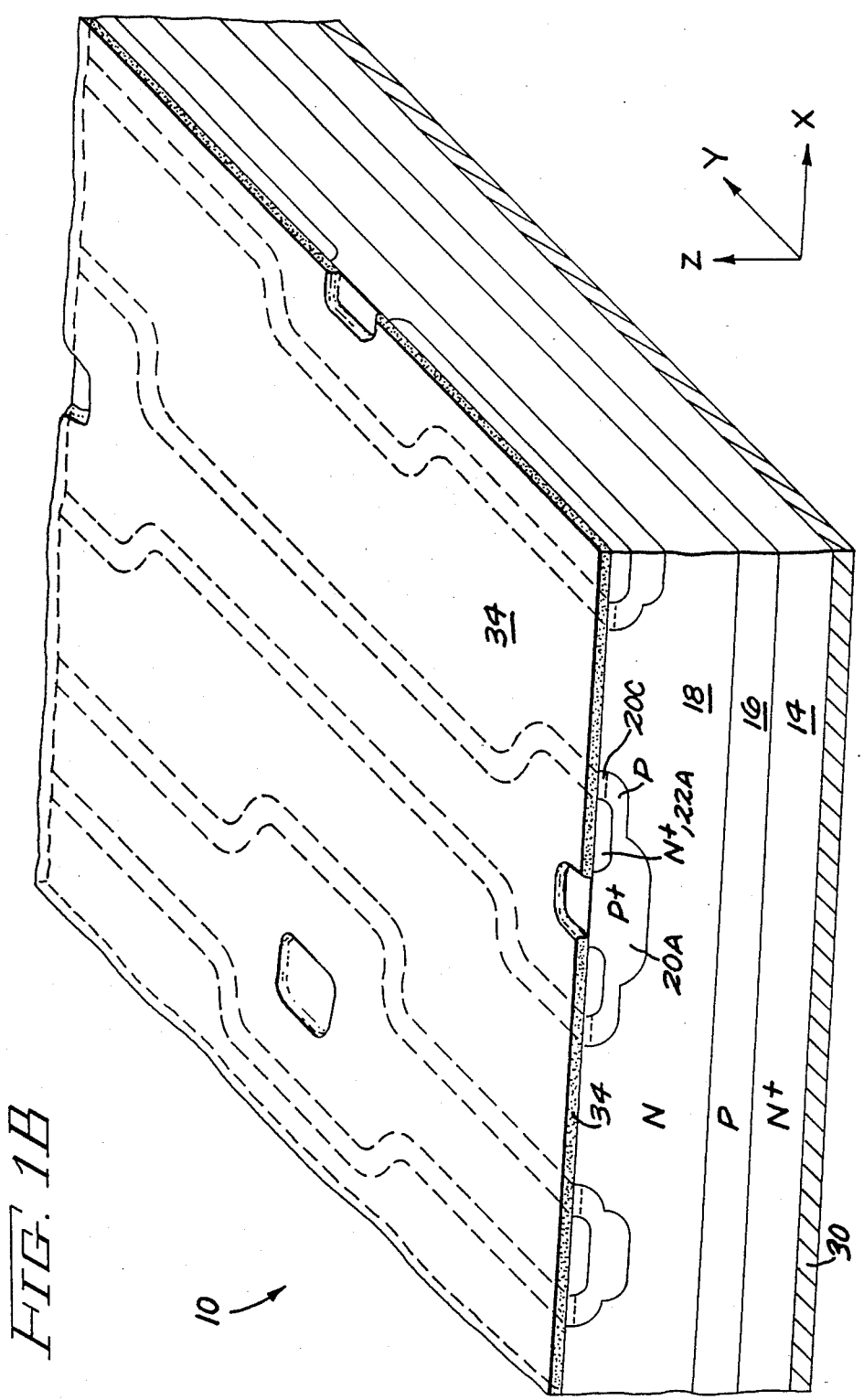
Figure 1D:
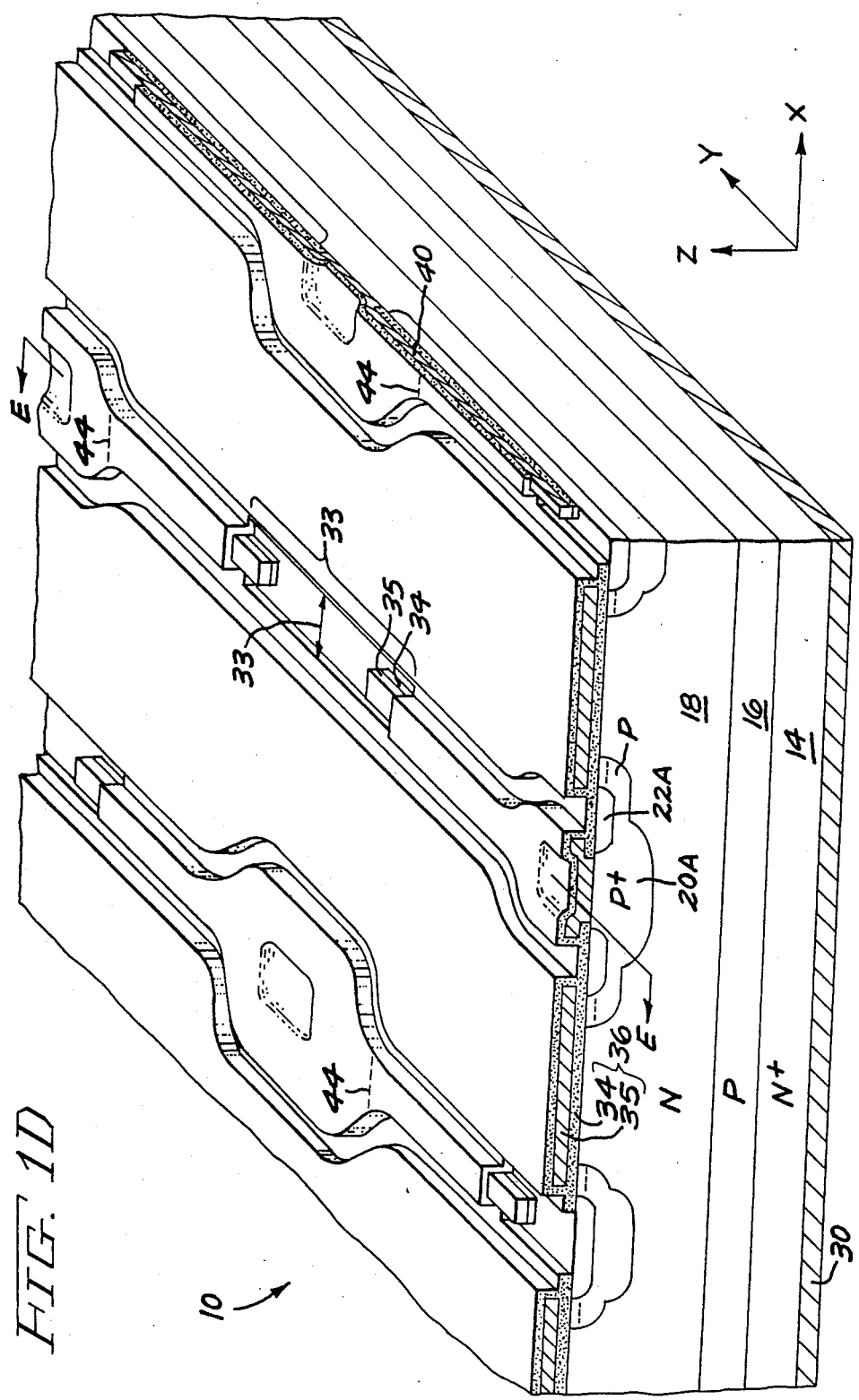
Figure 1E:
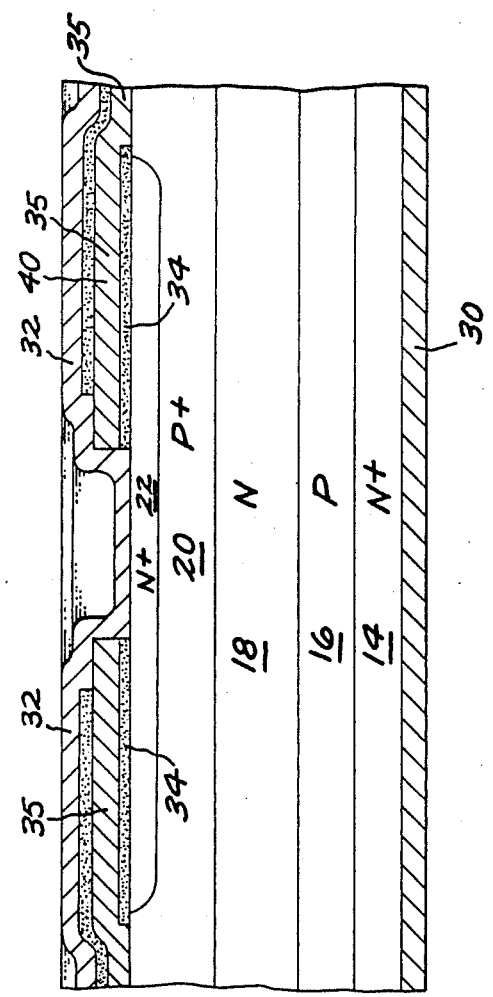
FIG. 1E is a cross-section through FIG. 1D along the line E—E with an additional layer which is not shown in FIG. 1D included in FIG. 1E.

An MOS (metal-oxide-semiconductor) controlled thyristor or MCT 10 in accordance with the present invention is illustrated in stylized perspective views in FIGS. 1A-1D and in cross-section in FIG. 1E. FIGS. 1A-1D show the device 10 with various levels exposed in order to clearly illustrate the structure and configurations of the various parts of the device. In FIG. 1A, the device is shown with the upper surface 13 of the semiconductor body exposed. In FIG. 1B, the device is shown with a patterned insulating layer (preferably thermally grown $SiO_2$ in the case of a silicon device) disposed on the upper surface 13 of the semiconductor body. In FIG. 1C, the device is shown with patterned polysilicon gate conductors and turn-off-assist resistor bodies disposed on the dielectric layer. In FIG. 1D, the polysilicon is shown with its surface oxidized and contact windows 33 for electrode contact to the semiconductor body and the turn-off-assist resistors are shown. In FIG. 1E, the device is shown in a cross-section taken along the line E—E in FIG. 1D. FIG. 1E includes the contact metallization 32, which for clarity, is omitted from FIG. 1D. Metallization 32 covers the upper surface of the structure shown in FIG. 1D while making contact only in the contact windows 33 shown in FIG. 1D. FIGS. 1A-1D include an XYZ rectangular coordinate system in the lower right corner for direction reference in these figures.

Referring now to FIG. 1A, the MCT 10 comprises a body 12 of semiconductor material having a first, N type emitter layer 14 of high doping concentration (N+). A P type base layer 16 is disposed on the upper surface of the layer 14 and forms a first PN junction 15 therewith. An N type base layer 18 is disposed on the upper surface of the P type base region 16 and forms a second PN junction 17 therewith. A plurality of Y-direction elongated segments of a P type emitter region 20 extend downward into the N type base layer 18 from the upper surface 13 of the semiconductor body and each forms a segment of a third PN junction 19 therewith. A segment of an N− source region 22 is disposed within each of the segments of the emitter region 20, forms a segment of a fourth PN junction 21 therewith and extends to the upper surface of a semiconductor body.

The upper and lower, opposed, surfaces of the semiconductor body 12 are each substantially planar and comprise the major surfaces of the semiconductor body. A first power or cathode electrode 30 is disposed on the lower surface of the body 12 in ohmic contact with the N+ emitter layer 14. In the embodiment shown, the layer 30 is preferably disposed in contact with the entire lower surface of the N+ region 14 to provide maximum contact area. A second or anode power electrode 32 (shown only in FIG. 1E) is disposed over the upper surface 13 of the semiconductor body in ohmic contact with the source region 22 and in ohmic contact with one end of each of a plurality of turn-off-assist resistor segments 40 (shown in FIGS. 1C-1E). The other ends of the resistor segments 40 are each disposed in ohmic contact with a different selected portion of the P type emitter region 20. This insertion of a resistor in series between the power electrode and the emitter region is directly contrary to the industry practice of minimizing resistance in the power current path. The benefits which this resistor provides are discussed hereinafter.

The upper or P type emitter region 20 has a first, high doping concentration portion 20A which is shown elongated in the Y-direction (FIG. 1A). However, other configurations, including circular or rectangular may be employed as desired. The first portion 20A of the P emitter 20 may be referred to as a high doping concentration or high injection efficiency portion of the upper emitter 20 because its high doping concentration makes it an efficient injector of carriers into the adjacent N base 18.

Along the outer periphery of the P type emitter region 20, a channel portion 20C of the emitter region is disposed adjacent the upper major surface 13 of the semiconductor body and has a lower impurity doping concentration than the first portion 20A of emitter 20. Along the upper surface of the device, this channel portion 20C spaces the N+ source region 22 from the N type base region 18. An insulated gate electrode 36 (FIGS. 1C and 1D) is disposed over channel portion 20C of the emitter region in order to provide MOS gate control of the conductivity of the channel portion 20C for electrons flowing between the N type base region 18 and the source region 22. Channel portion 20C of emitter region 20 is less conductive and is a less efficient emitter of its majority carrier holes into the N type base layer 18 than is the more heavily doped first portion 20A.

The greater the doping concentration in an emitter region, the more efficient it is at injecting its majority carriers into an adjacent base region of opposite conductivity type for a fixed doping concentration in that base region. In this sense, efficiency is proportional to the number of carriers injected by the emitter region into the base region per second per unit junction area at a given forward bias voltage or forward voltage drop.

The PN junction 19 includes a first portion 19A disposed between the first emitter portion 20A and the base region 18. The source region 22, extends the full length of the first portion 20A of the emitter region.

The source region 22 is configured with a plurality of openings 23 therethrough at each of which the first portion of the emitter region 20A extends to the upper surface 13 of the semiconductor body and into ohmic contact with an overlying turn-off-assist resistor segment 40 (FIG. 1C) which provides an ohmic connection to the anode electrode 32.

The insulated gate electrode 36 comprises an insulating layer 34 (which is preferably a native oxide grown from the semiconductor body and is shown in FIGS. 1C and 1D) disposed directly on the upper surface 13 of the semiconductor body and an overlying conductive material 35 which serves as the conductor of the insulated gate electrode. The conductive material 35 is disposed so that it extends over the channel portion 20C of emitter region 20 from the PN junction 19 to the PN junction 21. If desired, either for fabrication tolerance reasons or device operating characteristics, the conductive portion 35 of the insulated gate electrode 36 may also extend over the base region 18 and the source region 22 as shown in FIG. 1D.

The turn-off-assist resistor segments 40 provide the only connection between the first portion 20A of the emitter region 20 and the anode electrode 32 (FIG. 1E) and serve to increase the potential drop between the base region 18 and the anode electrode 32 (FIG. 1E) and thus the source region 22 when the device is in a conductive state. The inclusion of these turn-off-assist resistor segments in the main device current path is contrary to the accepted practice and design effort in this art because these resistor segments cause an increase in the ON-state resistance, voltage drop and power dissipation of the device. However, in accordance with this invention, this increased voltage drop is localized at a point in the structure where its presence enables the MOS structure comprised of base 18, channel portion 20C and source region 22 to divert more current from the ON-state regenerative current path of thyristor 10 than would be possible in the absence of the resistor segments and thus enables the thyristor to turn off increased currents. This is considered a beneficial trade off for circuits in which high currents could prevent prior art MCTs from turning off in response to control signals applied to the gate electrode. Appropriate selection of the value of the resistance $R_2$ of the entire turn-off-assist resistor which is comprised of all of the segments 40 connected in parallel enables thyristor 10 to turn off any desired level of current.

In operation, the device 10 is rendered conductive in any of the many ways known for thyristors, including the injection of gate current, exposure to light, internally generated carriers, a turn-on MOS gate and other triggering mechanisms. Once the device has been rendered conductive, i.e., latched in the ON-state by internal regenerative action, the device conducts current in the regenerative mode between the anode electrode 32 and the cathode electrode 30 vertically through the structure. The resistance of the turn-off-assist resistor is selected in accordance with the desired current turn-off capacity of the MCT. At the maximum intended steady state operating current for the device, the voltage drop through each resistor segment 40 is preferably less than a few tenths of a volt, say 100 millivolts.

While the device is in the ON-state, the voltage drop from the anode electrode 32 to the portion of the N type base region 18 which is adjacent to the emitter portion 20A, is equal to the forward voltage drop of the PN junction 19A at that location plus any resistive voltage drop within the P type emitter portion 20A plus the voltage drop in the turn-off-assist resistor segment(s) 40 through which current flows to that portion of the junction. The resistive voltage drop in the highly conductive emitter portion 20A will normally not be significant. However, at surge currents (e.g. ten times the steady state rating), the voltage drop in the turn-off-assist resistor segment 40 provides a significant increase in the voltage difference between the anode electrode 32 and the base region 18. This could be, for example, 1 volt. Using polysilicon for the turn-off-assist resistor is helpful because, at high temperatures, the resistance of the resistor increases by about a factor of two for each 75° C. increase in temperature. This provides additional source-region-to-first-base-region bias (1 volt for a total of at least 1.7 volts in the above example) under the conditions at which the MCT has the highest current gain and is normally the hardest to turn off.

In the structure 10 of FIG. 1, the turn-off-assist resistor segments 40 are implemented in the form of portions of the polycrystalline silicon 35 which in other portions of the device serves as the conducting portion 35 of the insulated gate electrode 36. The portion of the polycrystalline silicon 35 which serves as the resistor segments 40 is isolated from the gate electrode portion of polycrystalline silicon, but may preferably have the same thickness and doping concentration in order to simplify the manufacturing process. Polycrystalline silicon having the same doping level can serve both as the high conductivity gate electrode and as the body of the resistor segments 40 because the gate electrode has a relatively large area, draws little current and therefore produces very little voltage drop. The length and width of the polysilicon region which comprises a turn-off-assist resistor segment 40 are selected so that when currents in excess of the design value are flowing through the device, the resistor polysilicon has a high current density therein which results in its small resistance producing a voltage drop which has a significant affect on device operation.

When it is desired to turn this device off, a significant positive voltage, such as about 15 volts, is applied to the insulated gate electrode 36 in order to render the channel portions 20C of the emitter region 20 conductive to electrons. As a consequence, electrons from the base region 18 are attracted, by the voltage difference between the anode electrode 32 and the N base 18, through the channel portions of emitter region 20 into the source region 22 and to the anode electrode 32. Those electrons which follow this path to the anode electrode bypass the emitting junction 19 thereby reducing the gain of the inherent PNP transistor of the thyristor. Provided a sufficient percentage of the electrons in the N type base region flow to the anode contact through this channel path, the sum of the effective current gains for the two inherent transistors in the thyristor falls below 1 and the regenerative action is interrupted and the device turns off. Such turn-off is aided by having the emitter regions relatively narrow from side-to-side in order that the resistance of the path within the base region from under the center of an emitter region segment up to the channel region is kept small to ensure that the portion of the emitting junction 19 which is most remote from the channel regions is pulled out of forward bias by this diversion of electrons. That is, if the resistance in the N base is too great, the electron flow therein can create a sufficient voltage drop that the center of the emitter remains forward biased. If the resistor segments 40 were replaced by short circuits, then for high ON-state currents, the electron diversion capacity of the MOS structure could be insufficient to interrupt the regenerative action of the high injection efficiency portion 19A of the PN junction 19. However, the presence of the resistor segments 40 which have a finite, small resistance, ensures the ability of gate control to interrupt the regenerative action of the portion 19A of the emitter junction.

For example, in a structure like device 10 of FIGS. 1A–1E, having an active area of 1 cm$^2$, a maximum steady state ON-state current of 100 amps (100 amp/cm$^2$) and 250,000 turn-off-assist resistor segments 40, each resistor segment (for equal current flow) conducts 0.4 mA and a resistance value of about 250 ohms is appropriate for each segment to create a voltage drop of about 0.1 volts at the maximum intended steady state current of 100 amps which causes an increase of 0.1 volt in the ON-state voltage and the voltage difference between the base region 18 and the anode electrode 32. One way to view the turn-off assist resistance is as a normalized resistance of 1 mΩ cm$^2$, rather than as 250,000 resistors per cm$^2$ each of which has a resistance of 250 Ω.

If the current through the device, at the time that a turn-off voltage is applied to the insulated gate electrode 36, is significantly above the designed maximum current for the device, as may occur under surge conditions, the voltage drop through the resistor segments 40 is increased beyond its normal tenth of a volt thereby increasing the electron diversion capacity of the channel current path. As a consequence of this characteristic, the device structure ensures that for an appropriate turn-off assist resistor value, the device, in response to gate control, will be able to turn off any level of current flowing in the device (except obviously currents which are so large the device structure is destroyed merely by the passage of that current). The resistance of the turn-off-assist resistor segments and the distribution within the device structure of the resistor segments 40 are matters to be determined in design trade-offs in accordance with the desired maximum current rating of the device, the maximum surge current which the device may be called upon to turn off under gate control and the number of resistor segments per unit active area of the device.

A suggested design philosophy is to design the turn-off assist resistor to be greater than the resistance of the current path of the turn-off FET. The impact of this is to change the MCT turn-off capability equation from (1) below to (2) below, i.e. without the turn-off assist resistor:

$$I_{OFF} \approx \frac{V_J(T)}{\alpha R_{FET}} \quad (1)$$

where $V_J(T)$ is the ON-state junction drop of the anode injecting junction 19 at a current it is desired to turn off (e.g. 0.8 volt at 25° C. at 100A/cm$^2$ or 0.48 volt at 200° C. at 100A/cm$^2$), $\alpha$ is the current gain of the lower transistor portion of the MCT and $R_{FET}$ is the effective resistance of the turn off FET to electrons. For worst case $I_{OFF}$, $\alpha$ can be assumed to be 1. With a turn-off-assist resistor added, $$I_{OFF} \gtrsim \frac{V_J(T) + I_{OFF} R_{ASSIST}}{R_{FET}} = \frac{V_J(T)}{R_{FET}} + I_{OFF} \frac{R_{ASSIST}}{R_{FET}} \quad (2)$$

Clearly, if $R_{ASSIST} > R_{FET}$, then turn-off current capability is indefinitely large. If $R_{ASSIST} = \frac{1}{2} R_{FET}$, then $I_{OFF}$ is "merely" doubled as compared to the no turn-off assist resistor case. Typically, $R_{FET}$ is of the order to 1 to 5 mΩ-cm$^2$ depending on channel width, length and the conductivity and width of the upper N-base stripes.

The description thus far has assumed a complementary MCT with an enhancement type turn-off FET. Clearly, equation (2) has no such restriction and the MCT could be normal and its turn-off FET could be either a depletion type or an enhancement type. If the resistance of the N+ source under the turn-off-assist resistor is significant, then one must realize that to get the effective $R_{ASSIST}$, one must subtract the lateral source resistance of the turn-off FET. For example, in FIG. 1E the N+ region could be 20Ω/□, leading to a net lateral resistance of about 60Ω. This would cause us, in our example, to design the $R_{ASSIST}$ to be 310Ω rather than 250Ω which would increase the forward drop at 100 A/cm$^2$ by 20 mV to 120 mV due to $R_{ASSIST}$.

While it is desirable to design the turn-off assist resistor to have a greater resistance than the turn-off FET, lesser resistances also produce beneficial, although reduced effects. Thus, turn-off assist resistors of any value are beneficial with such resistors having a resistance greater than one tenth of the resistance of the turn-off FET being more beneficial than smaller values and turn-off assist resistors larger than about one-quarter of the turn-off FET resistance being even more beneficial as are values of $\frac{1}{2} R_{FET}$ and $R_{FET}$.

While, for drawing clarity in FIGS. 1C and 1D, the polysilicon gate is shown as a plurality of Y-direction extending stripes, it is considered preferable to create a polysilicon gate grid by leaving cross connections between adjacent stripes. Such cross connections can each extend across a contact window 33 in the X-direction. If this cross connection is Y-direction centered in the window 33 shown in FIG. 1D, then window 33 is modified to have two segments—one on each Y-direction side of the cross connection.

Alternatively, rather than dividing the window 33 into two segments, the layout of the turn-off-assist resistors 40 can be modified to have only one segment for each contact, such as by eliminating the segment extending in the negative Y-direction as at the dashed lines 44 in FIG. 1D. The gate grid cross connection can then be placed between the location of the dashed line 44 and the contact window 33 (whose end would be displaced in the positive Y-direction toward dashed line 44).

Figure 2:
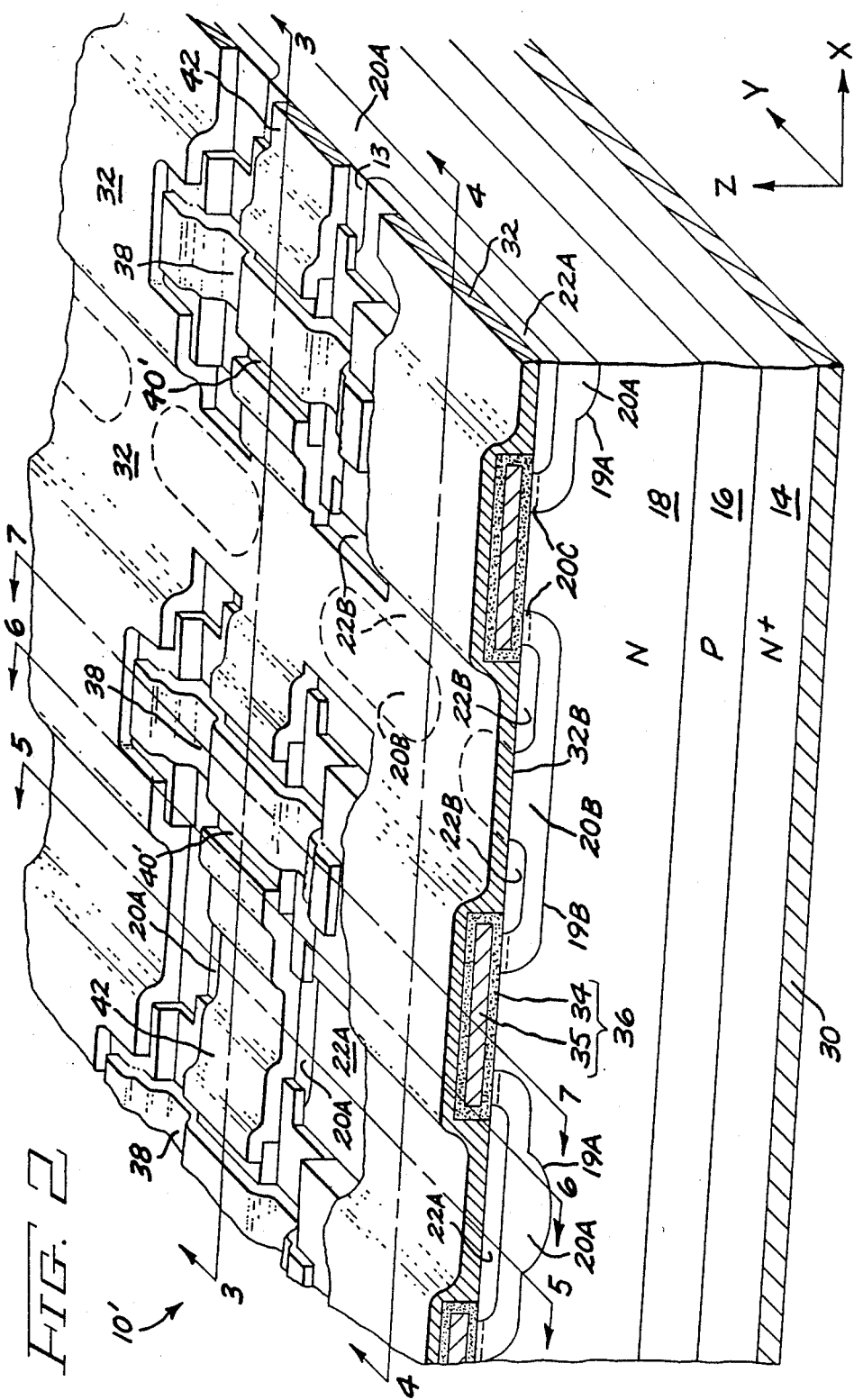
FIG. 2 is a perspective view of an alternative embodiment of an MCT in accordance with the present invention.

An alternative embodiment 10' of a device in accordance with the present invention is illustrated in perspective view in FIG. 2. This alternative configuration 10' differs from the basic device 10 of FIGS. 1A–1E in several aspects. First, in FIG. 2 the resistor segments 40' extend in the X-direction, i.e. perpendicular to the direction of elongation of the P emitter (Y-direction), rather than being elongated in the direction of elongation the P emitter regions as in structure 10 of FIG. 1. Further, in structure 10' of FIG. 2, the emitter 20 includes a second, relatively lightly doped portion 20B which includes a direct ohmic contact to the anode electrode 32 as at 32B. The portion 20B of the upper (P) emitter region 20 may be referred to as a direct portion of the emitter because of its direct ohmic contact to the anode electrode. As a result of its lower doping concentration, the portion 20B is less conductive and is a less efficient emitter of its majority carrier holes into the N type base layer 18, than is the more heavily doped first portion 20A. In general, it is considered preferable to have the remote portion of the emitter be a more efficient charge injector than the direct portion. However, the efficiencies of the remote and direct emitter portions may have any desired relationship which provides an effective device and may be made equal provided that does not interfere with gate controlled turn-off. The direct portion of the emitter may have an efficiency which ranges from being too low to provide latched conduction even in the absence of a turn-off voltage on the gate electrode, up to and including the same efficiency as or greater than the remote portion so long as the injection efficiency of the direct portion is low enough that application of a turn-off voltage to the gate electrode diverts enough electron current to break the regenerative action of the direct portion 20B of the emitter.

In the structure 10' of FIG. 2, the high doping level, high efficiency portion 20A and the relatively low doping, low efficiency portion 20B of the emitter region are each elongated in the Y-direction and are spaced apart in the X-direction and alternate in the X-direction. Corresponding first and second portions 22A and 22B of source region 22 are respectively disposed in the emitter portions 20A and 20B. The portion 22A of the source region which is disposed within the first portion 20A of the P type emitter region is configured without openings therein except where a turn-off-assist resistor segment 40 makes contact with the underlying emitter portion 20A. This is to prevent direct contact between the high efficiency portion 20A of the P type emitter region and the overlying anode electrode 32. The source region portion 22B disposed in the second emitter portion 20B is configured with a plurality of openings therethrough (shown in phantom as ovals) at which the emitter region portion 20B extends to the upper surface 13 of the semiconductor body and into ohmic contact with the overlying portion of the anode electrode 32. These openings in the source region portion 22B may comprise a single continuous stripe, if desired, although such a configuration has the disadvantage of reducing the area of the ohmic contact between the anode electrode 32 and the source region portion 22B. The relative area devoted to the contact between the anode electrode 32 and the source region portion 22B and the emitter region portion 20B may be a matter of design trade-off between the ON-state current carrying capacity and the gate turn-off capacity of the structure.

The emitter region portions 20A and 20B may be connected together in locations which are not illustrated in FIG. 2 provided that that connection is not formed in a manner which defeats the purpose, as is explained hereinafter, of having separate sections 20A and 20B. The source region segments 22A and 22B may also be connected at locations not shown in the figure.

While the device 10' is in the ON-state, the voltage drop from the anode electrode 32 to the portion of the N type base region 18 which is adjacent to the high efficiency emitter portion 20A is equal to the forward voltage drop of the PN junction 19A at that location plus any resistive voltage drop within the P-type emitter portion 20A plus the voltage drop in the turn-off-assist resistor segment(s) 40 through which current flows to that location. The voltage drop between the anode electrode 32 and the N type base region 18 adjacent to the second or low efficiency portion 20B of the P type emitter region, is equal to the forward voltage drop of the PN junction 19B at that location plus any resistive voltage drop within the P type emitter segment 20B. The resistive voltage drop in the highly conductive emitter portion 20A will normally not be significant. However, the tenth of a volt drop in the turn-off-assist resistor segment 40 provides a significant increase in the voltage difference between the anode electrode 32 and the base region 18. Since the N type base region 18 is flooded with carriers as long as the MCT is in the ON-state, there is little, if any difference in the potential of the base region 18 adjacent the different segments 20A and 20B of the P type emitter region. Consequently, the portion 19B of the emitter region has a forward bias across it which is more than that for the portion 19A. This aids in causing the portion 20B of the emitter region to emit carriers into the N type base region while the device is in the ON-state despite the lower injection efficiency of that portion of the emitter region.

Figure 7:
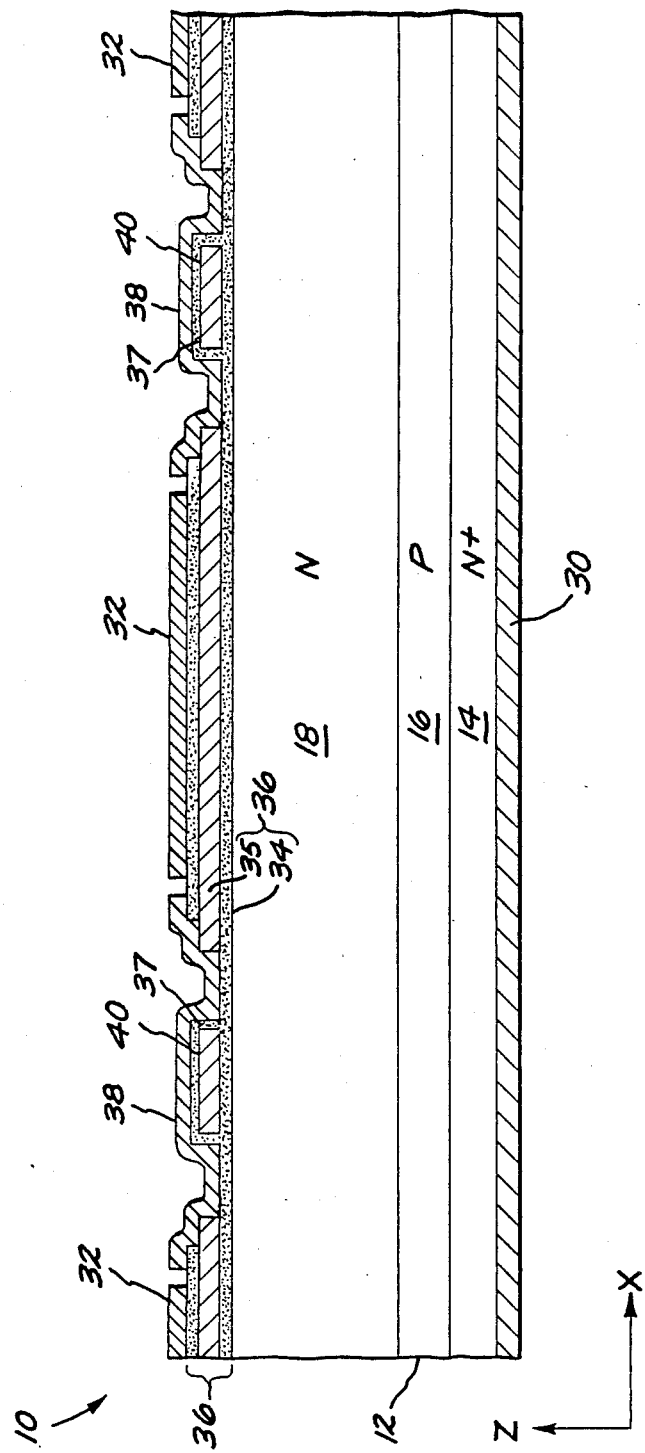

In the structure 10' of FIG. 2, like the structure 10 in FIG. 1, the turn-off-assist resistor segments 40 are implemented in the form of portions of the polycrystalline silicon which in other portions of the device is used as the conducting portion 35 of the insulated gate electrode 36. However, the implementation differs because of the differing orientation of the resistor segments which results in a plurality of discontinuous segments of gate electrode polysilicon 35 with adjacent gate segments along each emitter stripe being spaced apart in the Y-direction where a resistor segment is disposed. Y-direction adjacent ones of the spaced apart gate electrode segments are connected together by metallization stripes 38 which extend across, but are electrically insulated by layer 37 (FIGS. 3 and 7) from, the resistor segment 40 which is disposed between the gate segments it connects. The stripe 38 is disposed in ohmic contact with both of the gate electrode segments it connects.

Figure 5:
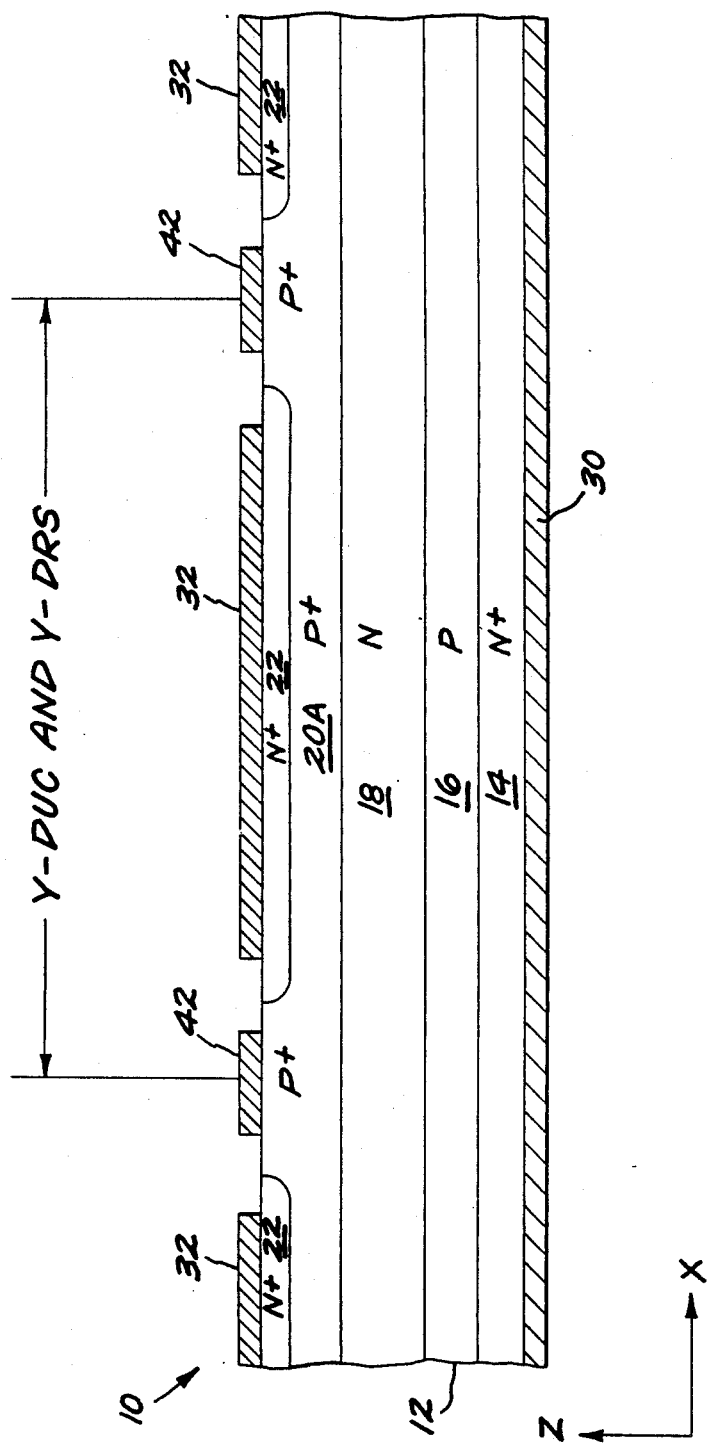
Figure 6:
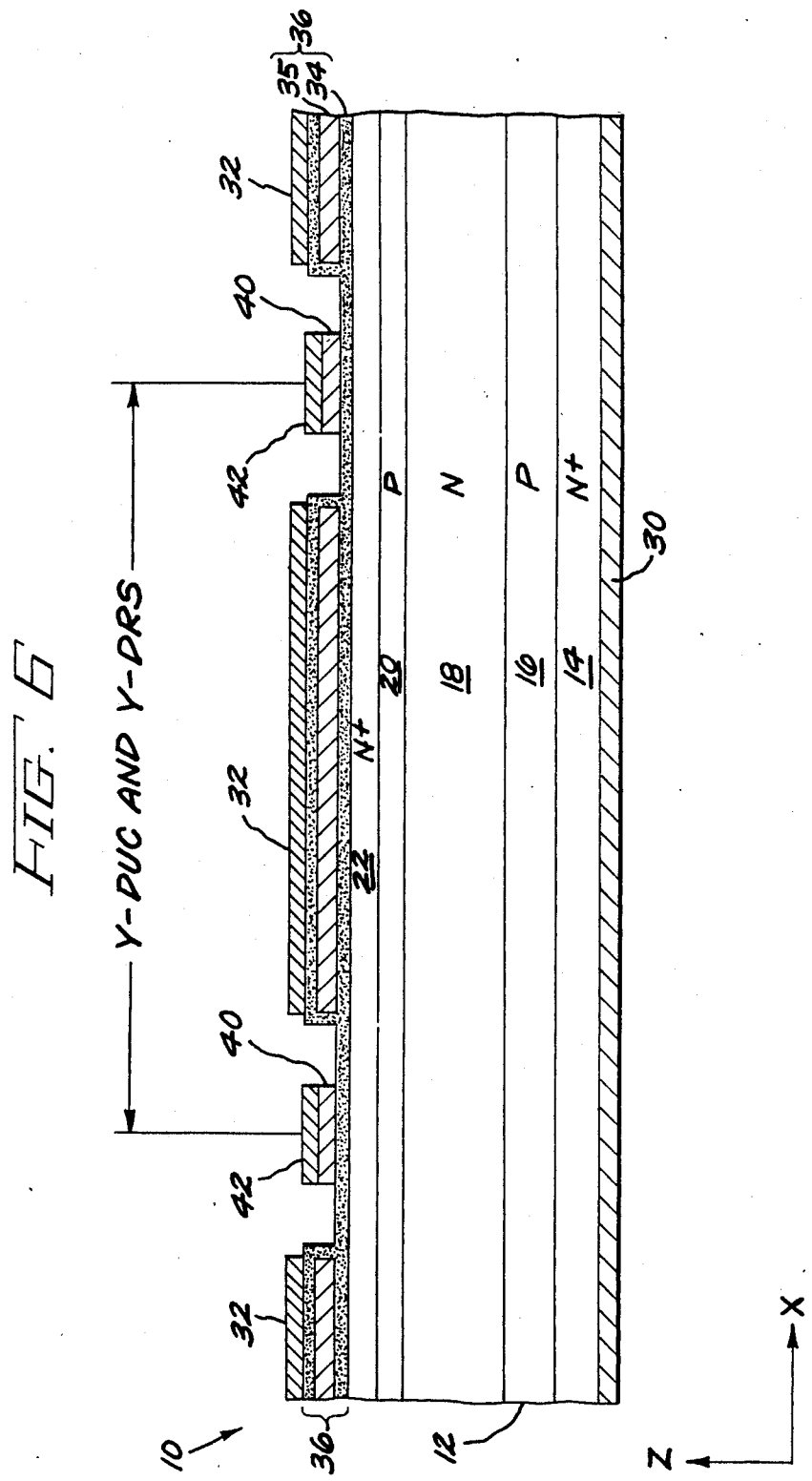

In FIGS. 3-6 and 10, the X-direction repeating structure is identified as X-DRS and the X-direction unit cell is identified as X-DUC. In FIGS. 5 and 6, the Y-direction unit cell is identified as Y-DUC and the Y-direction repeating structure is identified as Y-DRS. In this structure, Y-DUC is the same as Y-DRS.

In FIG. 2, the anode electrode 32 has openings in it where the gate connection metal stripes 38 are disposed and where the high-efficiency-emitter-to-resistor metal connectors 42 are disposed. As a result, the anode electrode is configured as a grid. The portion 42 of the upper surface metallization which contacts the high efficiency portion 20A of the emitter region makes no contact to the source region 22 and no contact to the low efficiency portion of the emitter region. Thus, all current paths which connect the high efficiency portion of the emitter region to the anode contact of the device include a turn-off-assist resistor segment 40. This is seen more clearly in the cross-sections of FIGS. 3 and 5-7.

The first or high efficiency portion 20A of the emitter region is elongated in the Y-direction in the figure. A plurality of these elongated segments are arranged in parallel fashion and spaced apart in the X-direction. Adjacent ones of these first emitter portions 20A are spaced apart by portions of the base region 18 which extend to the upper surface of the semiconductor body and by further emitter region portions 20B which are also elongated in the Y-direction. The high efficiency emitter portions 20A are connected to the anode metallization only through the resistor segments 40.

Figure 3:
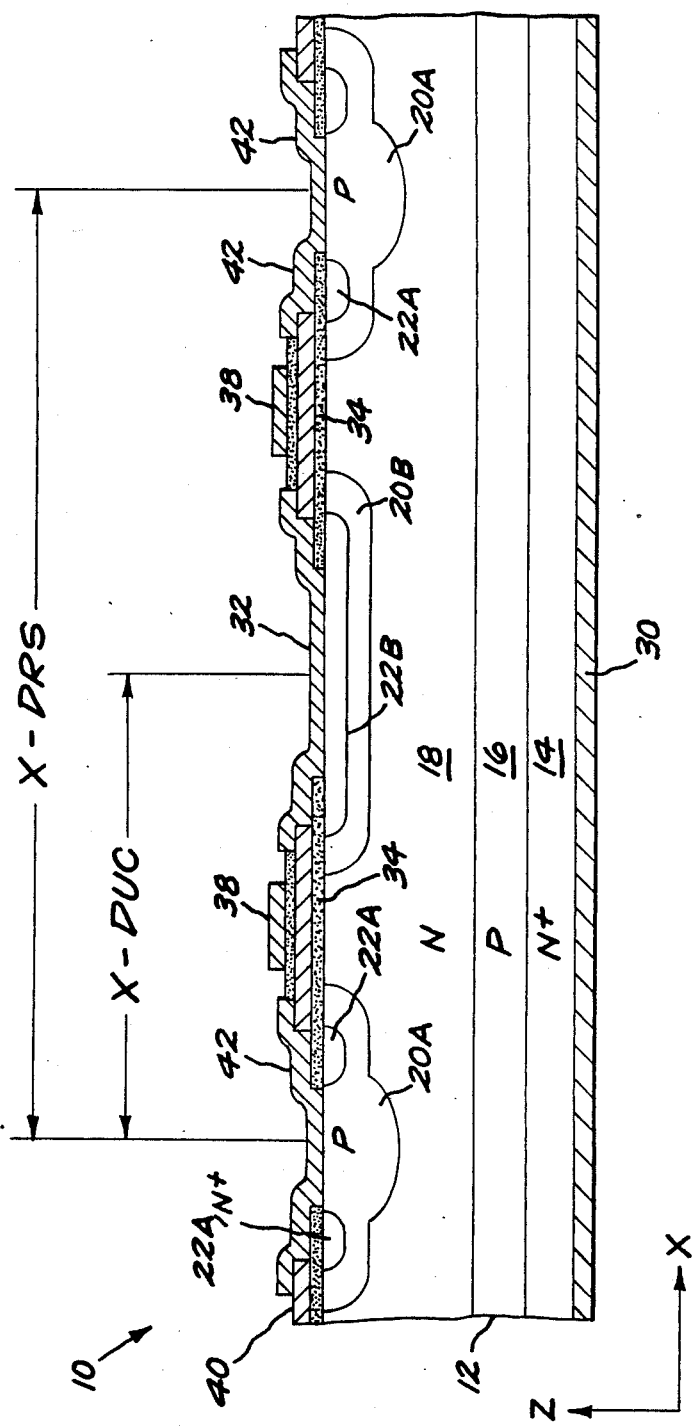
FIGS. 3-7 are cross-sections through the structure of FIG. 2 taken, respectively, along the lines 3—3, 4—4, 5—5, 6—6 and 7—7.
Figure 4:
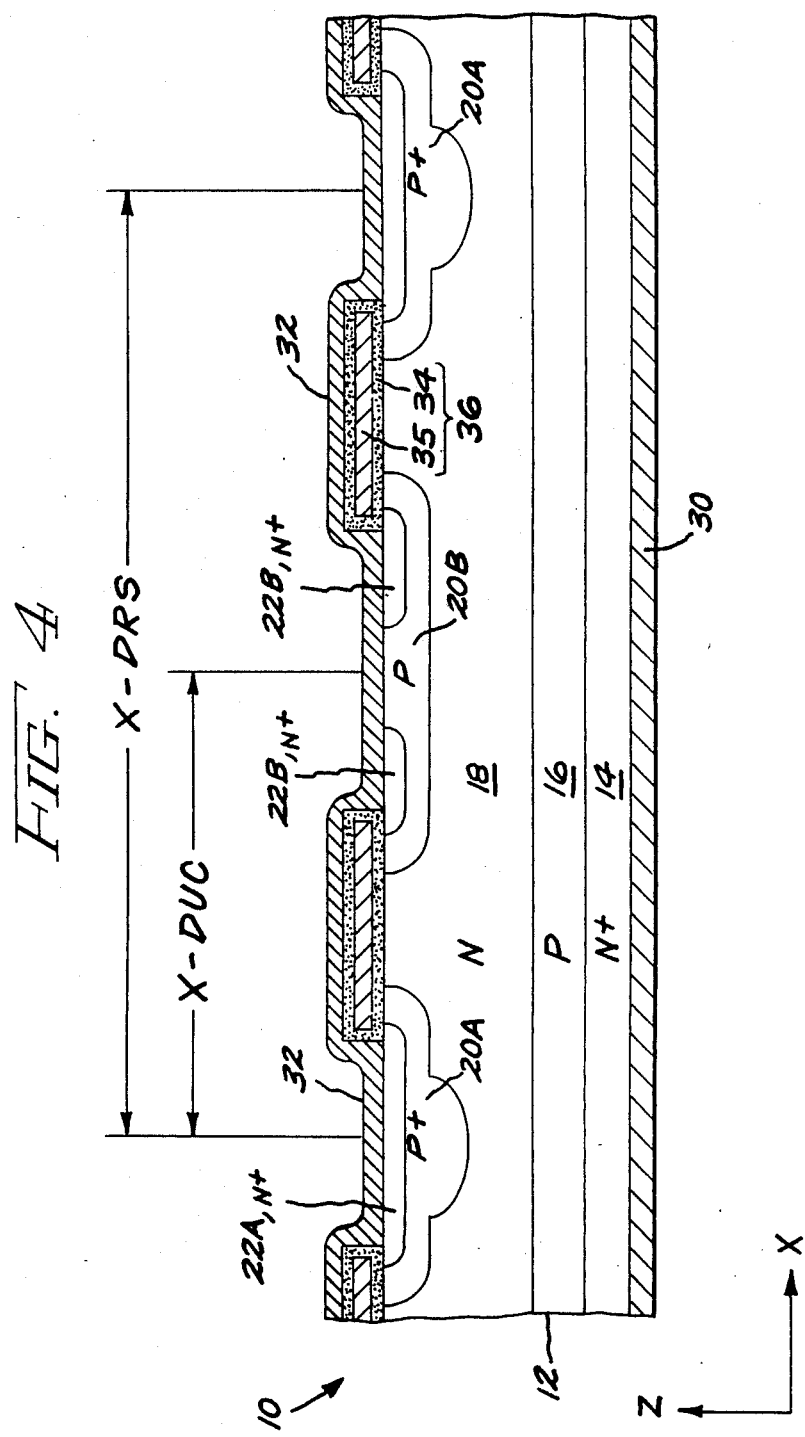

Both the high efficiency emitter portions 20A and the low efficiency portions 20B have channel region portions 20C which are relatively lightly doped, preferably to the same dopant concentration so that they may be rendered conductive by the same applied gate voltage. The turn-off-assist resistor segments 40 which connect adjacent ones of the emitter portions 20A to the anode metallization 32 maybe aligned in the X-direction as shown in FIGS. 2 and 3 or may be displaced from each other in the Y-direction in a systematic or random manner.

The high efficiency portions 20A are P+ diffusions which are driven deeper into the base region 18 than the low efficiency portions (channel regions) of the emitter region stripe in which they are located. However, it is not necessary that the high efficiency portions extend deeper into the base region so long as a high efficiency P+/N injecting junction is provided.

While device 10' is shown and has been described as having emitter portions 20A and 20B alternating, they can be interleaved in other ways, such as A, A, B, A, A, B, A, A, B to provide twice as many A portions as B portions. If desired, the percentage of A portions can be increased further if accompanied by an appropriate modification of the turn-off-assist resistor structure and the manner of its connection to the extra A portions.

The use of the gate polycrystalline silicon as the body of the turn-off-assist resistor segments 40 is a means of minimizing the complication of the device fabrication process. However, if it were desired to do so, the resistor segments 40 could be fabricated of other resistive materials such as Nichrome or of polycrystalline silicon having a different thickness and/or doping concentration than the gate electrode polysilicon. In the event that silicidation of the polycrystalline silicon of the gate electrode is employed in order to reduce its resistance, it is preferred to prevent the silicidation of the polycrystalline silicon forming the body of the resistor segments 40 since the resulting increase in conductivity would require narrower, tighter tolerance resistive strips 40 in order to provide the desired turn-off-assist resistance.

In FIG. 2, separate Y-direction elongated emitter stripes are used for the high and low efficiency portions of the emitter, with the resistor segments 40' extending in the X-direction in between them. The resistor segments 40' can extend perpendicular to the direction of emitter elongation even when all emitter stripes include a high efficiency portion by isolating each resistor's contact to the emitter in the manner shown in FIG. 2, but including resistors which contact each of the emitter regions.

Figure 8:
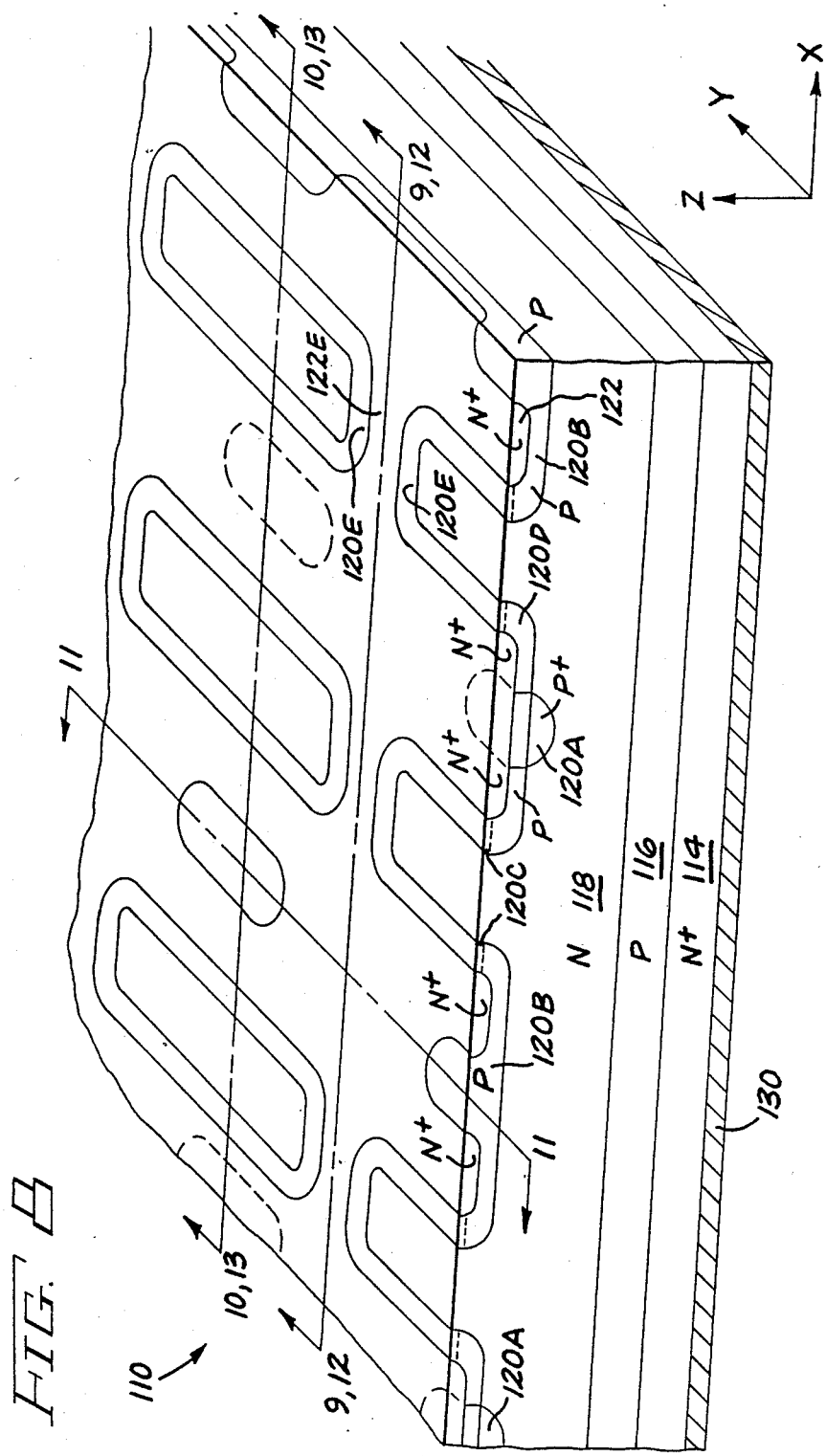
FIG. 8 is a perspective view of a further alternative embodiment of the MCT of FIG. 2.
Figure 9:
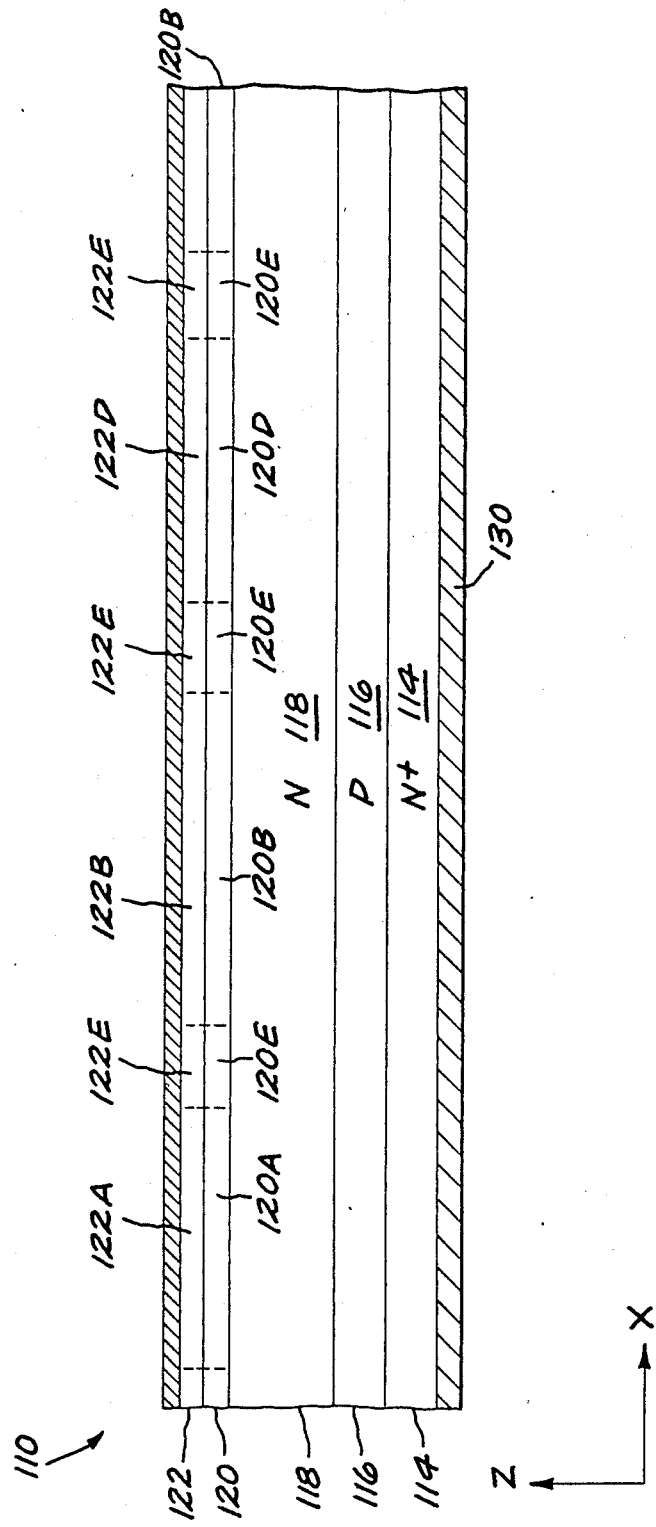
FIGS. 9-11 are cross-sections taken through the structure of FIG. 8, respectively along the lines 9—9, 10—10 and 11—11.
Figure 10:
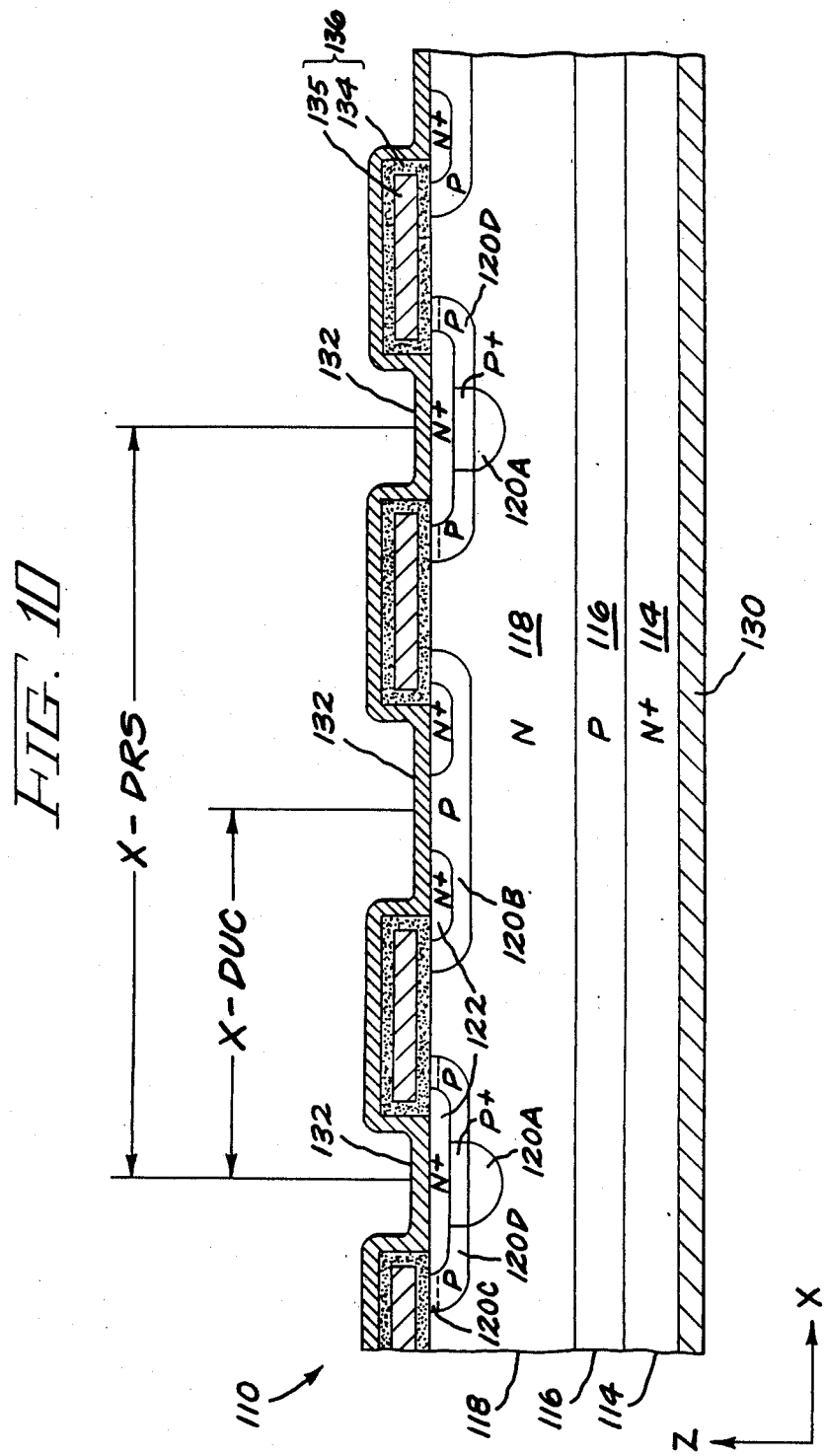
Figure 11:
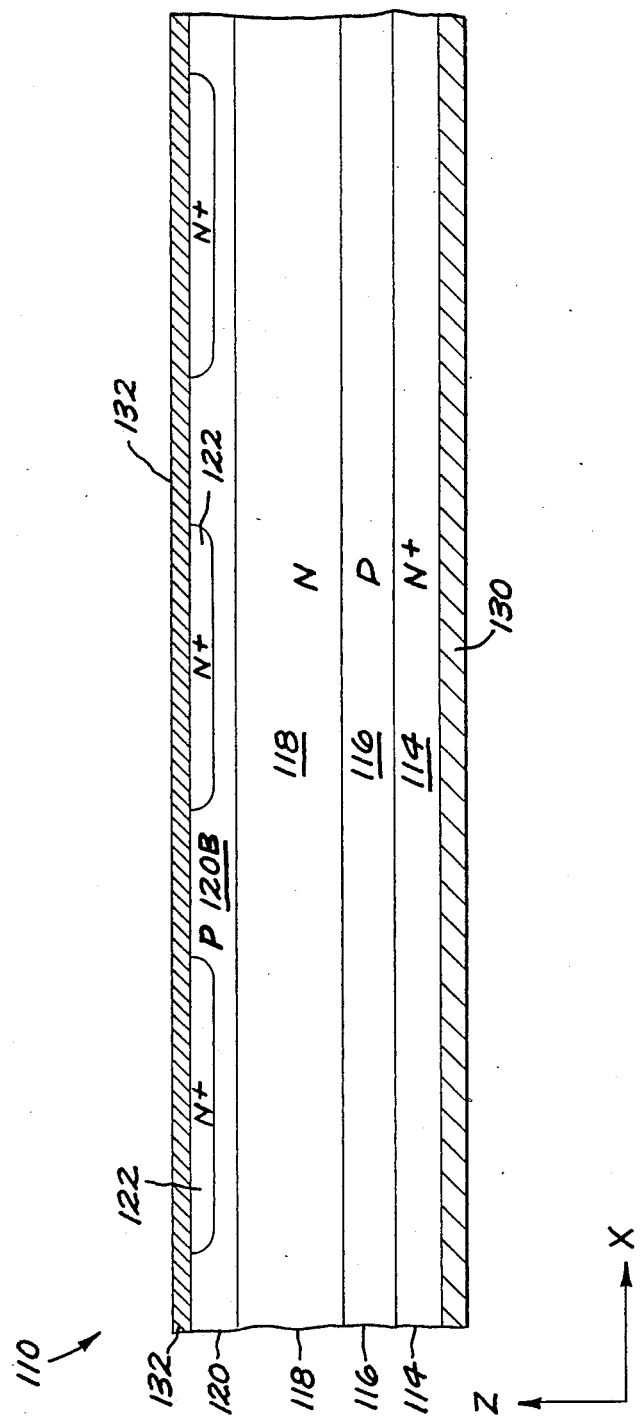

A device 110 having an alternative configuration for the turn-off-assist resistor and the source and P type emitter regions as compared to the device 10' is illustrated in perspective view in FIG. 8 and in cross-sections in FIGS. 9-11. The reference numerals in FIG. 8-11 have been increased by 100 relative to those in FIGS. 1-7 in order to clearly distinguish which device structure is being discussed. In general, the portions of the structure identified by reference numerals ending in the same two digit number serve the same function in both structures and are not separately discussed in connection with device 110 (FIGS. 8-11), except as is necessary to clearly explain the differences in the devices and their operation. In FIG. 8, the upper surface metallization and gate electrode are omitted in order to more clearly illustrate the underlying semiconductor structure. However, the upper surface metallization and gate electrode are included in the cross-sections in FIGS. 9-11.

The most significant distinction between the device 110 of FIG. 8 and the device 10' of FIG. 2 is the incorporation of the turn-off-assist resistor (140) into the semiconductor structure itself in device 110. In the structure 110 shown in FIG. 8, the low efficiency portions 120B of the emitter region are elongated in the Y-direction and spaced apart in the X-direction in a manner similar to that for the device 10' of FIG. 2. In device 110, the high efficiency emitter portions 120A are configured as spaced apart P+ portions disposed within elongated, Y-direction extending emitter segments 120D which are interleaved with the second portions 120B of the emitter region and connected thereto by emitter portions 120E. These high efficiency portions 120A have no direct contact to the anode electrode, but rather are spaced therefrom by the lower doping concentration, lower injection efficiency portion 120B of the emitter region 120. This is contrary to the standard practice in this art of providing a heavily doped portion of the emitter region which directly connects the power electrode to the heavily doped portion of the emitter region which forms a portion of the emitter/base junction.

The gate electrode 136 (FIG. 10) may preferably be used as the mask for the formation of the low efficiency emitter region and with an additional mask masking contact portions of the emitter region as the source region mask. A separate mask is used to define the high efficiency portions 120A of the emitter region. The high efficiency portions 120A of the emitter region may be formed either prior to or subsequent to the formation of the main, low efficiency portions of the emitter region. However, since the high efficiency region must form a PN junction with the base region 18, it is preferred, if both dopants diffuse at the same speed, to deposit and partially drive the dopant which forms the high efficiency portions of the emitter prior to depositing and driving the dopant which forms the low efficiency portion. This ensures that the high efficiency portion will diffuse further into the semiconductor body than the low efficiency portion. The source region 122 is then formed in the emitter region in a manner to leave apertures in the source region through which the low efficiency emitter region portion 120B extends to the upper surface of the semiconductor body where the anode electrode will form an ohmic contact to the emitter region. These apertures in the source region are positioned remote from the high efficiency portions 120A of the emitter region in order to force carriers flowing to the high efficiency portion 120A of the emitter region 120 to flow through the low efficiency portion from an ohmic contact to the anode electrode. This causes the low efficiency portions to serve as the turn-off-assist resistor segments. These regions may be formed by ion implantation or by diffusion, as may be preferred.

Figure 12:
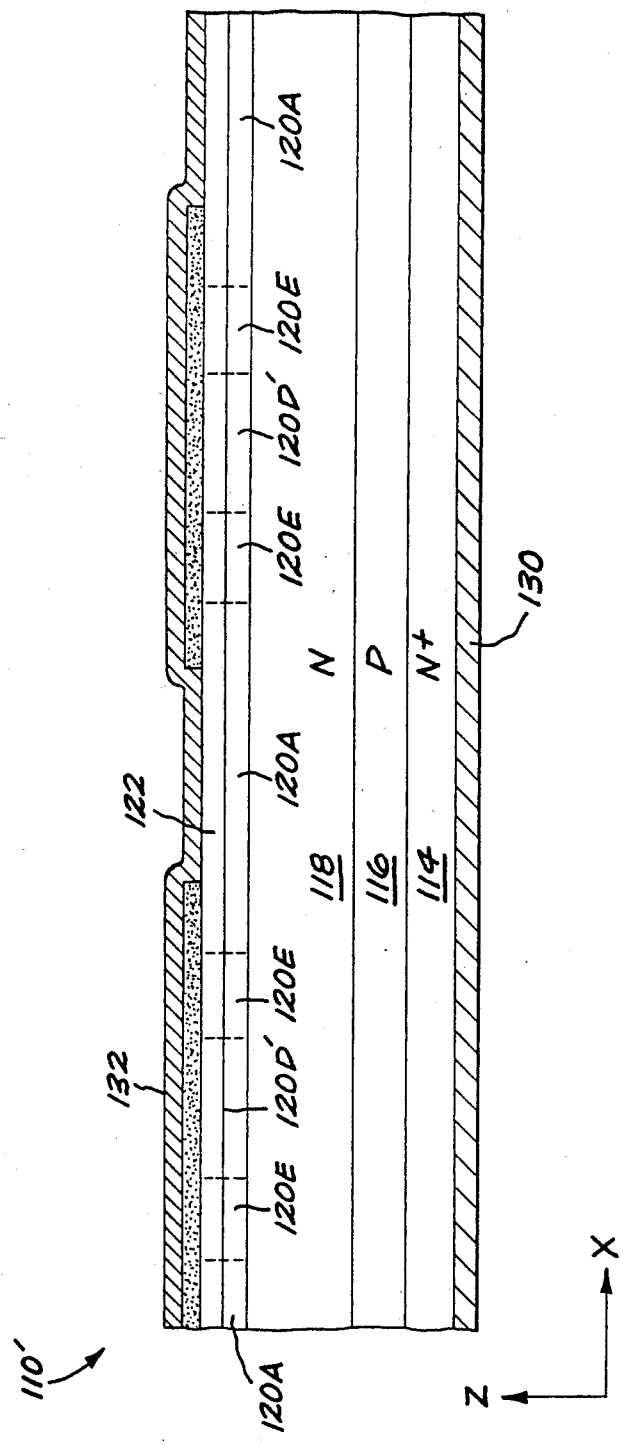
FIGS. 12 and 13 are cross-sections through a modified version of the FIG. 8 structure (not shown in perspective) taken along the lines 12—12 and 13—13 in FIG. 8.
Figure 13:
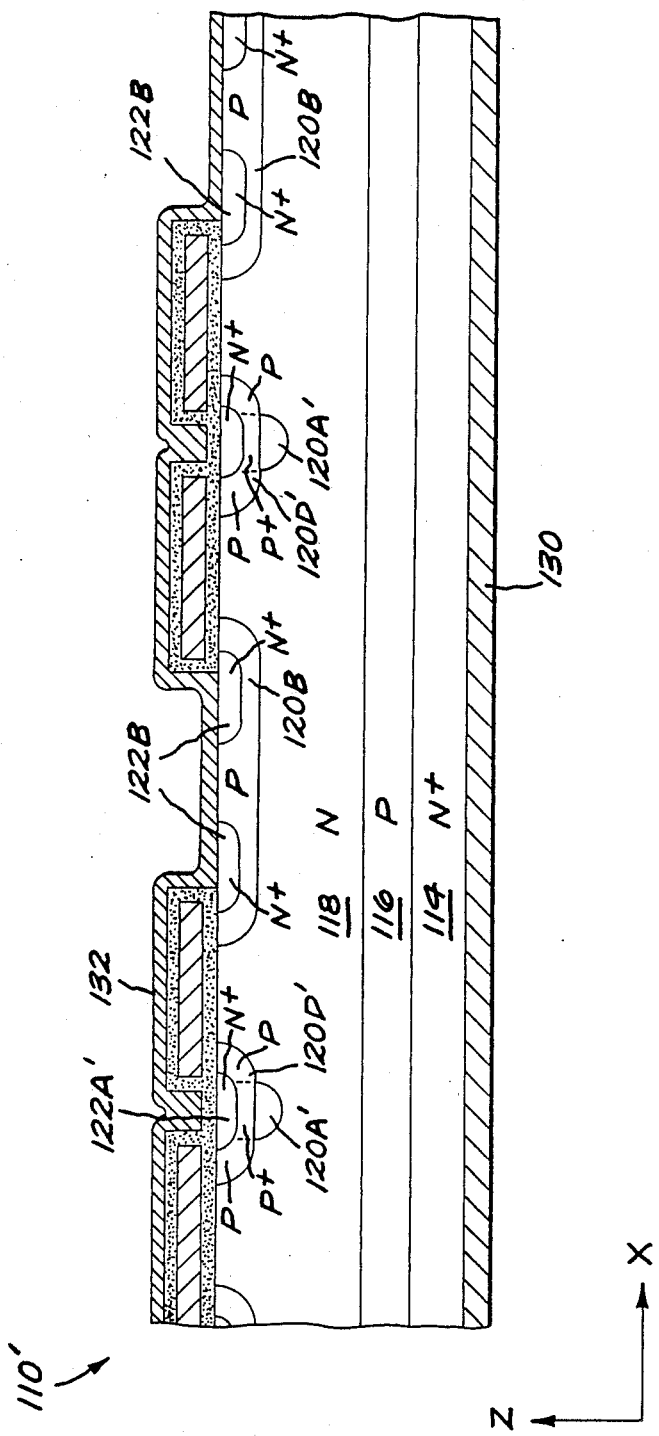

After formation of the source region 122, the anode electrode 132 is deposited over the upper surface of the device in a manner to contact the source region along the length of stripes 120B and 120D. The cross connection or bridge portions 122E of the source region 122 are preferably ohmically contacted by the anode electrode, but such contact may be omitted where the emitter region and the source region are sufficiently narrow in these bridges that design rules prevent metallic contact from being made to the source region in those locations. Further, in a modified version 110' of this structure, as shown in FIGS. 12 and 13, the emitter region portions 120E' and the source region portions 122D' may be made too narrow for direct metallic contact. This increases the density of emitting regions per unit of semiconductor body surface area.

The device 110 has an advantage over device 10 in that its fabrication process is simpler because the turn-off assist resistor is incorporated into the semiconductor structure itself. However, there is an attendant disadvantage in that the resistance of the region providing the turn-off-assist resistance can be modulated by the presence of increased concentrations of carriers during the time the device is in its regenerative ON-state. Thus, resistance modulation must be taken into account in determining the size, configuration and doping concentration in the portion of the emitter region which connects the high efficiency portions to the ohmic contact with the anode electrode.

Figure 14:
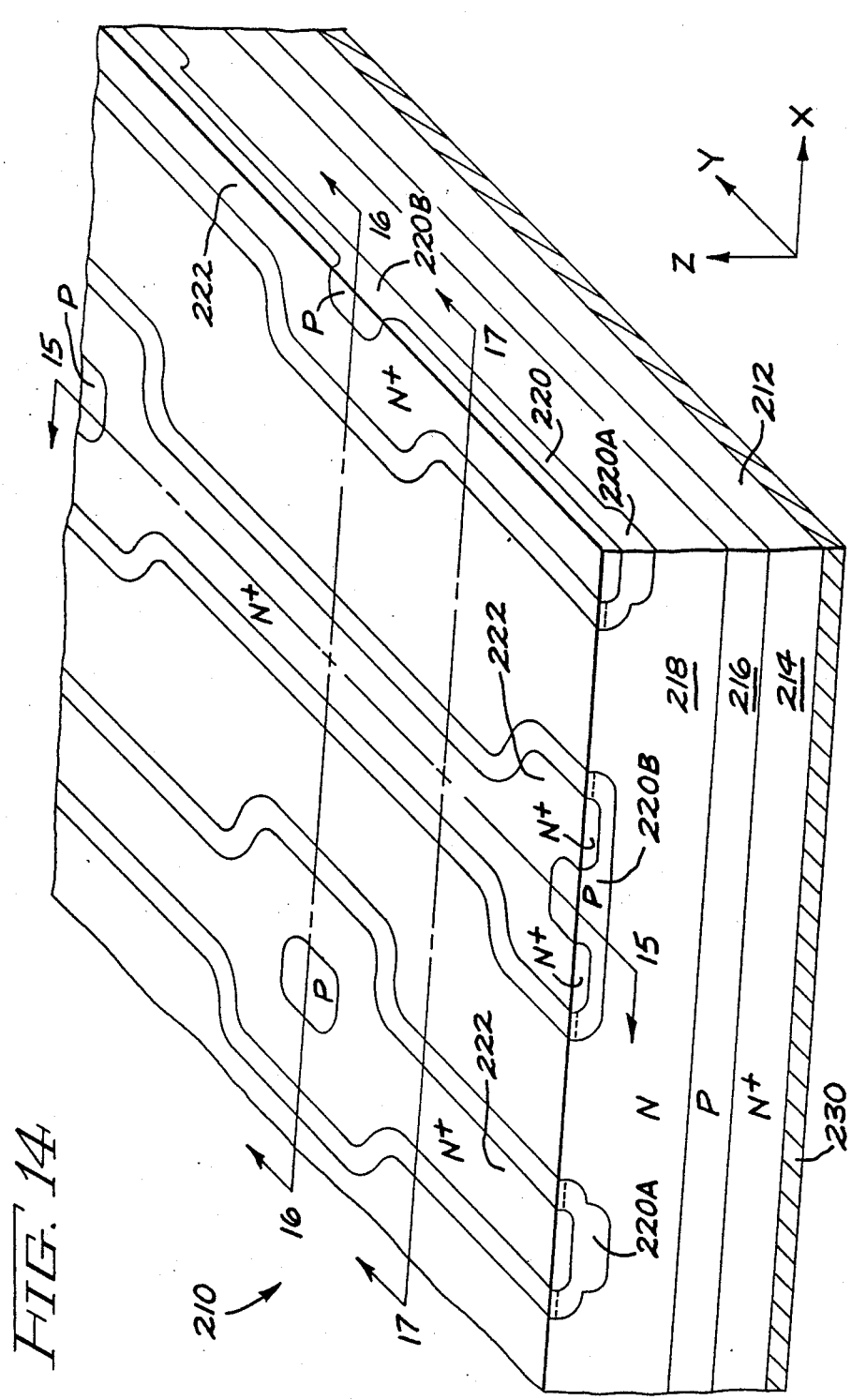
FIG. 14 is a perspective view of a further alternative embodiment of an MCT.

A further alternative device structure 210 is illustrated in perspective view in FIG. 14. The device 210 is similar to the device 10 of FIGS. 1A-1E in having parallel emitter stripes which are not connected together by emitter material to form a lattice and similar to the device 110 in having the turn-off-assist resistor incorporated into the semiconductor structure. Here again, reference numerals differing by 100 or 200 from reference numerals in devices 10 and 110 identify similar structure which is only discussed here if a modification in it makes its discussion necessary to a proper understanding of the device structure and its operation.

The device 210 differs from the device 110 in that each Y-direction elongated segment of the emitter region incorporates high efficiency portions 220A, low efficiency portions 220B, and resistor portions 240. Adjacent elongated emitter segments need not, but may, be connected. The high efficiency portions 220A are spaced from the ohmic contact between the anode electrode 232 and the low efficiency portions 220B of the emitter region in order that the portion of the emitter region which spaces the high efficiency portion 220A from the ohmic contact may serve as the turn-off-assist resistor.

In order to achieve maximum packing density of emitter regions in this device structure, the emitter region is made wide enough to enable a contact to be made to the emitter region within the source region only at spaced apart locations in the Y-direction. The locations of these contacts in X-direction adjacent stripes are Y-direction displaced in order to minimize the X-direction center-to-center separation of adjacent stripes. It is convenient to dispose the high efficiency emitter portions of each emitter stripe in X-direction alignment with the contact location in the X-direction adjacent stripe.

Figure 15:
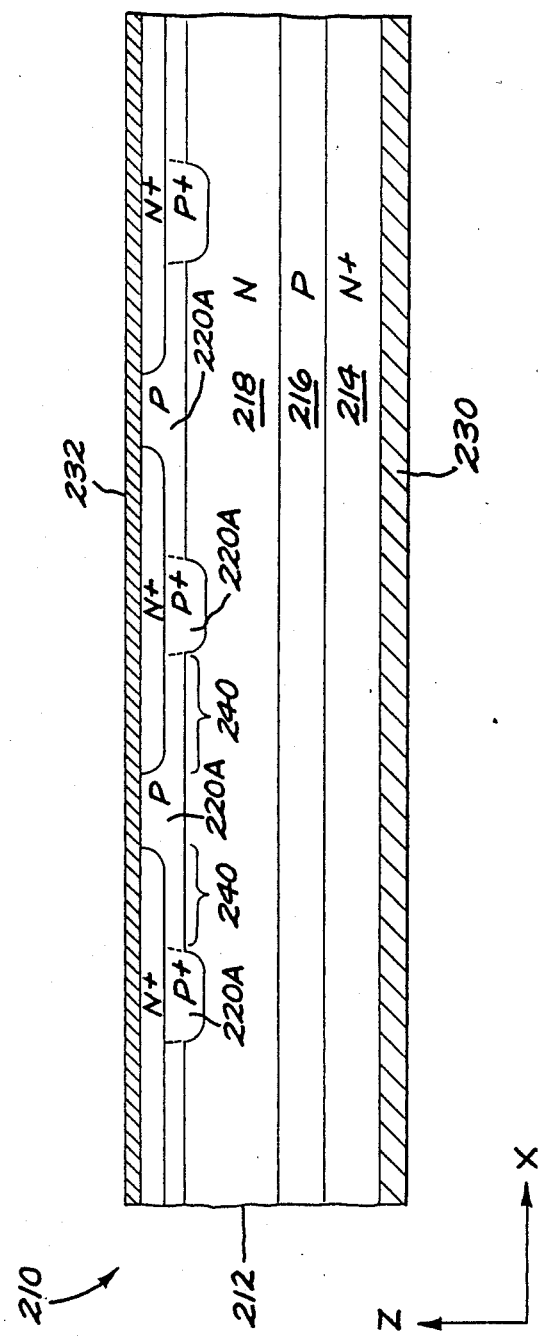
FIGS. 15-17 are cross-sections through the structure of FIG. 14 taken respectively along the lines 15—15, 16—16 and 17—17.
Figure 16:
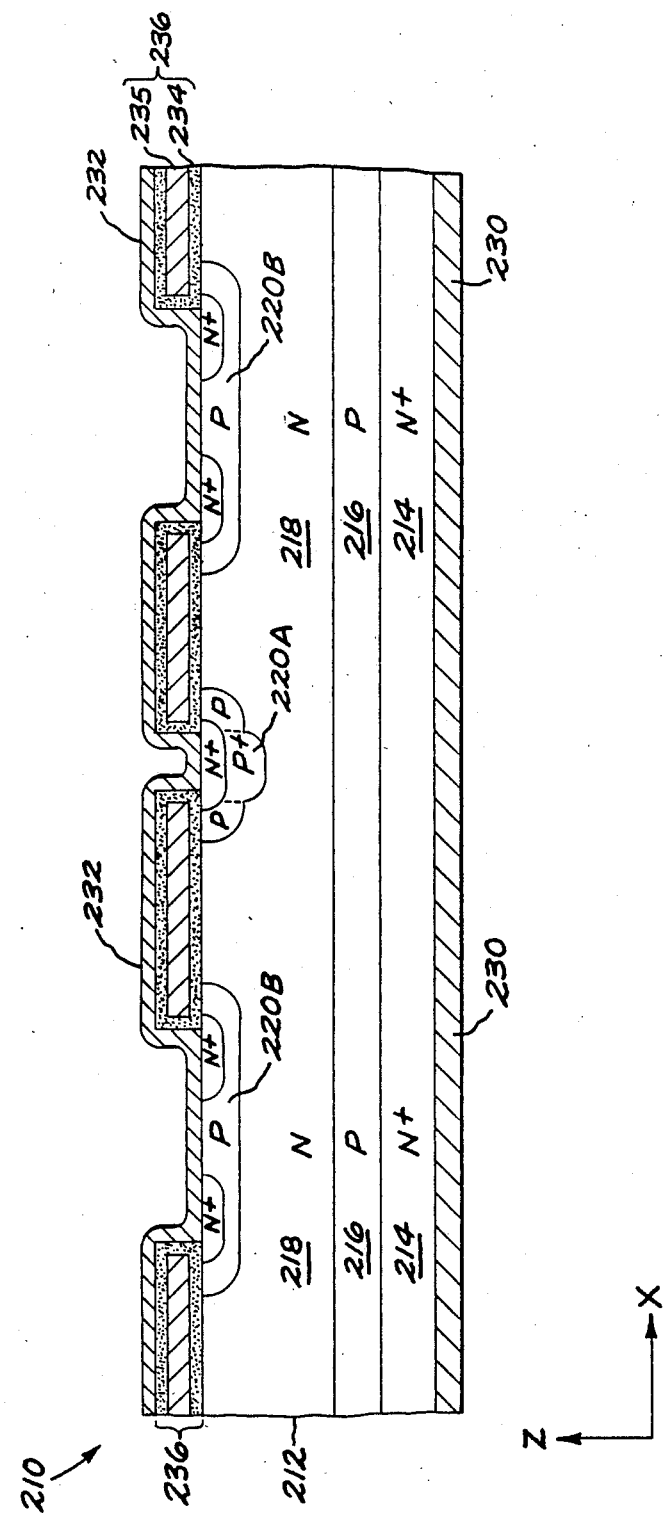
Figure 17:
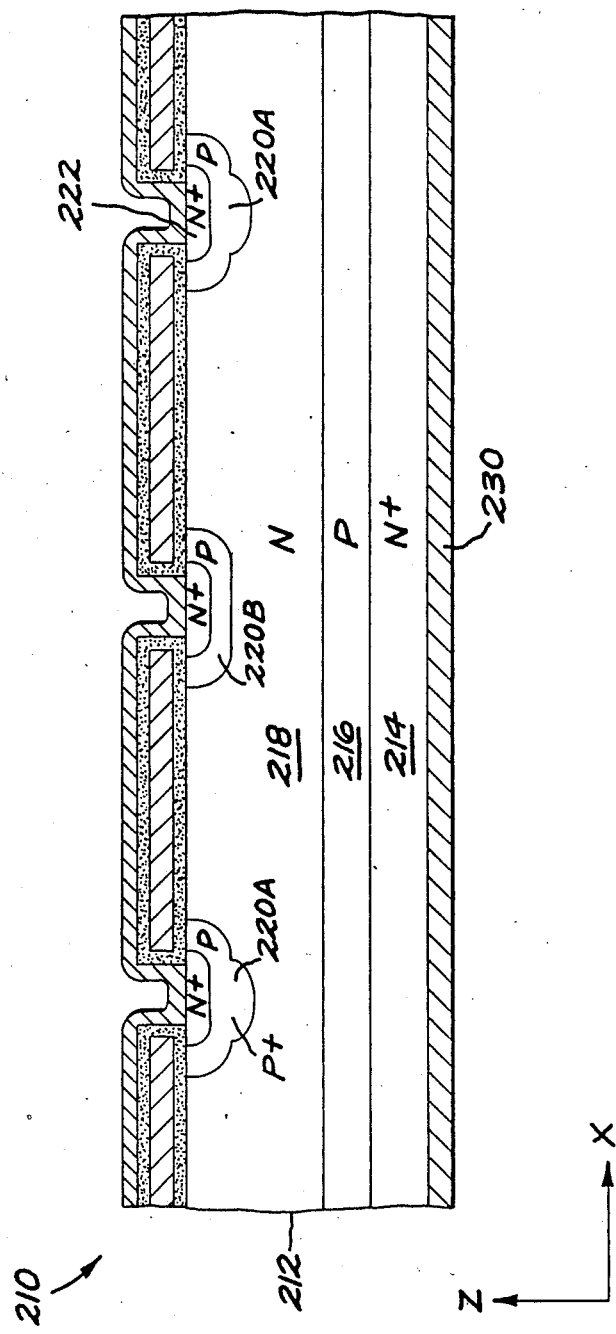

In FIG. 14, the anode electrode and the gate electrode are omitted from the figure in order that the structure of the emitter and source regions may be clearly illustrated. The gate electrode and anode metallization are included in the cross-sections shown in FIGS. 15, 16 and 17. It is believed that in this manner it is made clear that the anode metallization only contacts the emitter region at the low efficiency contact locations 220B and is everywhere else spaced from the emitter region by the source region. The gate electrode is disposed over the entire outer periphery of each emitter region segment or stripe in order to maximize the channel width per stripe and thus per unit area of the device in order to maximize gate turn-off capacity.

In devices 110 and 210, the high efficiency portion A of the emitter region is positioned physically remote from the ohmic contact between the low efficiency, direct portion B and the anode metallization. This is in order that the intervening portion of the emitter region may serve as the turn-off-assist resistor. In the devices 10 and 10' of FIGS. 1 and 2, this same result is obtained by use of the external resistor. The greater the resistance per unit length of the region which connects the high efficiency portion to the anode electrode, the smaller the distance by which the high efficiency portion must be spaced from the anode electrode. Consequently, when the high efficiency portion is specified as being remote from the ohmic contact, it will be understood that this means that the high efficiency portion is resistively spaced from that ohmic contact and does not require any specific minimum physical spacing. It will be understood that the term ohmic connection means a non-rectifying connection and encompasses both connections which have a fixed resistance value and connections whose resistance value varies as a result of modulation of the resistance of a portion of or all of its current path, or as a result of other phenomena.

For simplicity in the drawings, each of the embodiments of the device which has been illustrated has been illustrated with the turn-off-assist resistor included only in the upper, P type emitter region. However, those skilled in the art will readily recognize that this technique is equally applicable to the N+ emitter region alone or to both the P type emitter region and the N type emitter region in the same device. Similarly, the device has been illustrated with planar structures in which the gate electrodes are disposed on the upper surface of the semiconductor body. The turn-off-assist resistor may also be incorporated in structures in which trench gates are employed so long as the high efficiency portions of the emitter region are resistively spaced from ohmic contacts to the main terminal metallization. The emitter segments have been shown as being straight elongated structures, but may take any other appropriate configuration, including, but not limited to concentric closed curves (circles, ovals, rectangles, etc.) and two dimensional arrays of active areas. A given device design can be optimized for different current levels by changing either the sheet resistance of the material which provides the turn-off-assist resistor or by changing the geometry of the region which functions as that resistor. Any type of insulated gate FET may be used as the turn-off FET. The turn-off-assist resistors are distributed throughout the structure, preferably in each cell because the ability to turn off the MCT is dependent on being able to turn off each cell and thus, the ability to turn off arbitrarily large currents is dependent on each cell having a similar capability. Further, inclusion of the resistor in the cell minimizes inductance which would tend to interfere with desired operation (1) at high frequencies and (2) with abrupt surges.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A MOS controlled thyristor comprising:
first and second power electrodes;
a body of semiconductor material having first and second opposed major surfaces, said body including:
 a first emitter region of one type conductivity extending to said first major surface,
 a first base region of opposite type conductivity disposed adjacent to and forming a first PN junction with said first emitter region,
 a second base region of said one type conductivity disposed adjacent to and forming a second PN junction with said first base region,
 a second emitter region of said opposite type conductivity disposed adjacent to and forming a third PN junction with said second base region, extending to said second major surface of said body and disposed in ohmic contact with said second power electrode,
 a source region of one type conductivity disposed within said second emitter region, extending to said second major surface of said body and disposed in ohmic contact with said second power electrode,
 said second emitter region including:
  a first relatively high doping concentration portion, and
  a channel portion having a lower doping concentration, said channel portion being disposed adjacent to said second surface and extending between said source and second base regions;
an insulated gate electrode disposed on said second major surface and extending from said source region to said second base region across said channel portion of said second emitter region for controlling the conduction of one type conductivity carriers through said channel portion of said second emitter region between said source region and said second base region;
said second base region, said channel region and said source region comprising a turn-off FET, said turn-off FET exhibiting a first resistance $R_1$ between said second base region and said second power electrode; and
a resistor disposed in the current path between said first portion of said second emitter region and said second power electrode, said resistor having a second resistance $R_2$, $R_2 \geq R_1/10$.

2. The MOS controlled thyristor recited in claim 1 wherein:
when said thyristor has a main bias applied across said first and second power electrodes, the value $R_2$ of said second resistance is substantially independent of whether said thyristor is in a conductive state or a non-conductive state.

3. The MOS controlled thyristor recited in claim 1 wherein:
said first portion of said second emitter region is elongated in a first direction; and
said resistor comprises a body of resistive material which is elongated in said first direction.

4. The MOS controlled thyristor recited in claim 1 wherein:
said resistor has first and second ends, said first end being spaced from said second power electrode and ohmically connected to said first portion of said second emitter region and said second end being spaced from said first portion of said second emitter region and ohmically connected to said second power electrode.

5. The MOS controlled thyristor recited in claim 4 wherein:
said body of resistive material is disposed over said second emitter region and does not extend over either said second base region or said channel portion of said second emitter region.

6. The MOS controlled thyristor recited in claim 4 wherein:
said first portion of said second emitter region is elongated in a first direction; and
said body of resistive material is elongated in said first direction.

7. The MOS controlled thyristor recited in claim 4 wherein:
said first portion of said second emitter region is elongated in a first direction; and
said body of resistive material is elongated in a second direction which is not parallel to said first direction.

8. The MOS controlled thyristor recited in claim 7 wherein:
said second direction is substantially perpendicular to said first direction.

9. The MOS controlled thyristor recited in claim 1 wherein:
said resistor has a first end ohmically connected to said second power electrode; and
a second end ohmically connected to said first portion of said second emitter region.

10. The MOS controlled thyristor recited in claim 9 wherein:
said resistor is disposed external to and supported by said body of semiconductor material.

11. The MOS controlled thyristor recited in claim 10 wherein:
the conductive material of said insulated gate electrode comprises polycrystalline silicon; and
said resistor comprises polycrystalline silicon.

12. The MOS controlled thyristor recited in claim 11 wherein:
the polycrystalline silicon comprising the gate conductor and the polycrystalline silicon comprising the resistor have substantially the same thickness.

13. The MOS controlled thyristor recited in claim 12 wherein:
said gate polycrystalline silicon and said resistor polycrystalline silicon have substantially the same doping level.

14. The MOS controlled thyristor recited in claim 10 wherein:
said external resistor extends substantially parallel to said first direction.

15. The MOS controlled thyristor recited in claim 1 wherein:
said channel portion of said second emitter region extends along substantially the entire periphery of said second emitter region.

16. The MOS controlled thyristor recited in claim 1 wherein:

$R_2 \geq R_1/4$.

17. The MOS controlled thyristor recited in claim 1 wherein:

$R_2 \geq R_1/2$.

18. The MOS controlled thyristor recited in claim 1 wherein:

$R_2 \geq R_1$.

19. A MOS controlled thyristor comprising:
first and second power electrodes;
a body of semiconductor material having first and second opposed major surfaces, said body including:
a first emitter region of one type conductivity extending to said first major surface,
a first base region of opposite type conductivity disposed adjacent to and forming a first PN junction with said first emitter region,
a second base region of said one type conductivity disposed adjacent to and forming a second PN junction with said first base region,
a second emitter region of said opposite type conductivity disposed adjacent to and forming a third PN junction with said second base region, extending to said second major surface of said body and disposed in ohmic contact with said second power electrode,
a source region of one type conductivity disposed within said second emitter region, extending to said second major surface of said body and disposed in ohmic contact with said second power electrode,
said second emitter region including:
a first relatively high doping concentration portion spaced from said second power electrode, and
a channel portion having a lower doping concentration, said channel portion being disposed adjacent to said second surface and extending between said source and second base regions;
an insulated gate electrode disposed on said second major surface and extending from said source region to said second base region across said channel portion of said second emitter region for controlling the conduction of one type conductivity carriers through said channel portion of said second emitter region between said source region and said second base region;
said second base region, said channel region and said source region comprising a turn-off FET, said turn-off FET exhibiting a first resistance $R_1$ between said second base region and said second power electrode; and
an ohmic connection between said first portion of said second emitter region and said second power electrode, said ohmic connection having a second resistance $R_2$, $R_2 \geq R_1/10$.

20. The MOS controlled thyristor recited in claim 19 wherein:
said second emitter region further comprises a second, relatively low doping concentration, portion disposed in ohmic contact with said second power electrode; and
said ohmic connection comprises at least part of said second portion of said second emitter region.

21. The MOS controlled thyristor recited in claim 20 wherein:
said second portion of said second emitter region is elongated in a first direction and makes ohmic contact to said second power electrode at a first location; and
said first portion of said second emitter region is connected to said second portion at a second location which is spaced in said first direction from said first location.

22. The MOS controlled thyristor recited in claim 21 wherein:
said second emitter region comprises a plurality of first direction elongated segments, said segments being spaced apart in a second direction perpendicular to said first direction and each including a segment of said first portion, a segment of said second portion and a segment of said ohmic connection between said second portion and said second power electrode; and
said segment of said ohmic connection between said first portion and said second power electrode in one of said first direction elongated segments is aligned in said second direction with said segment of said second portion in a second-direction-adjacent first-direction-elongated segment.

23. The MOS controlled thyristor recited in claim 20 wherein:
said second power electrode makes direct ohmic contact to said second emitter region only in said second portion of said second emitter region.

24. The MOS controlled thyristor recited in claim 19 wherein:

$R_2 \geq R_1/4$.

25. The MOS controlled thyristor recited in claim 19 wherein:

$R_2 \geq R_1/2$.

26. The MOS controlled thyristor recited in claim 19 wherein:

$R_2 \geq R_1$.

27. A multicellular MOS controlled thyristor comprising:
first and second power electrodes;
a body of semiconductor material having first and second opposed major surfaces, said body including:
a first emitter region of one type conductivity extending to said first major surface,
a first base region of opposite type conductivity disposed adjacent to and forming a first PN junction with each of said segments of said first emitter region,
a second base region of said one type conductivity disposed adjacent to and forming a second PN junction with said first base region,
a second emitter region of said opposite type conductivity disposed adjacent to and forming a third PN junction with said second base region and extending to said second major surface of said body and disposed in ohmic contact with said second power electrode and comprising a plurality of segments,
a plurality of source region segments of said one type conductivity, each of said segments of said second emitter region having one of said source region segments disposed therein and forming a segment of a fourth PN junction therewith, each of said source region segments extending to said second major surface of said body and being disposed in ohmic contact with said second power electrode, each segment of said second emitter region including:
- a first relatively high doping concentration portion, and
- a channel portion having a lower doping concentration, said channel portion being disposed adjacent to said second major surface and extending between said source region segment and said second base region, an insulated gate electrode disposed on said second major surface and extending from said segment of said source region to said second base region across said segment of said second emitter region for controlling conduction of one type conductivity carriers through said channel portion of said segment of said second emitter region between said segment of said source region and said second base region; and for each of said segments of said second emitter region:
- said second base region, said channel portion of said second emitter region segment and said source region segment disposed therein comprising a segment of a turn-off FET, said segment of said turn-off FET having an ON-resistance of $R_1$, and
- a segment of an ohmic connection between said first portion of said second emitter region and said second power electrode, said segment of said ohmic connection having a second resistance $R_2$, $R_2 \geq R_1/10$.

28. The MOS controlled thyristor recited in claim 27 wherein in one of the cells:
- a second portion of said second emitter segment is elongated in a first direction and has a lower doping level than said first portion; and
- said first portion of said second emitter region segment is displaced from said second portion in a second direction perpendicular to said first direction.

29. The MOS controlled thyristor recited in claim 28 wherein, in one of the cells, said ohmic connection comprises:
- a resistor which is external to said semiconductor body, has a first end ohmically connected to said second power electrode and a second end ohmically connected to said first portion of said second emitter region segment.

30. The MOS controlled thyristor recited in claim 29 wherein:
- the conductive material of said insulated gate electrode comprises polycrystalline silicon; and
- said resistor comprises polycrystalline silicon.

31. The MOS controlled thyristor recited in claim 30 wherein:
- the polycrystalline silicon comprising the gate conductor and the polycrystalline silicon comprising the resistor have the same thickness.

32. The MOS controlled thyristor recited in claim 31 wherein:
- said gate polycrystalline silicon and said resistor polycrystalline silicon have substantially the same doping level.

33. The MOS controlled thyristor recited in claim 29 wherein:
said external resistor extends substantially parallel to said second direction.

34. The MOS controlled thyristor recited in claim 28 wherein said ohmic connection comprises:
- at least part of said second portion of said second emitter region.

35. The MOS controlled thyristor recited in claim 34 wherein:
said channel portion of said segment of said second emitter region extends along substantially the entire periphery of said segment.

36. The MOS controlled thyristor recited in claim 27 wherein:
- each segment of said second emitter region includes a second portion elongated in a first direction, said second portion having a lower doping concentration than said first portion and making ohmic contact to said second power electrode at a first location; and
- said first portion of said segment of said second emitter region is connected to said second portion at a second location which is spaced in said first direction from said first location.

37. The MOS controlled thyristor recited in claim 36 comprising:
- a plurality of first direction elongated emitter segments, said segments being spaced apart in a second direction perpendicular to said first direction; and
- said first portions of said adjacent segments are aligned in said second direction with said contacts between said second portion of said second emitter region and said second power electrode.

38. A MOS controlled thyristor comprising:
first and second power electrodes;
a body of semiconductor material having first and second opposed major surfaces, said body including:
- a first emitter region of one type conductivity extending to said first major surface,
- a first base region of opposite type conductivity disposed adjacent to sand forming a first PN junction with said first emitter region,
- a second base region of said one type conductivity disposed adjacent to and forming a second PN junction with said first base region,
- a second emitter region of said opposite type conductivity disposed adjacent to and forming a third PN junction with said second base region, extending to said second major surface of said body and disposed in ohmic contact with said second power electrode,
- a source region of one type conductivity disposed within said second emitter region, extending to said second major surface of said body and disposed in ohmic contact with said second power electrode, said ohmic contact having a first resistance $R_1$,
said second emitter region including:
- a first relatively high doping concentration portion, and
- a channel portion having a lower doping concentration, said channel portion being disposed adjacent to said second surface and extending between said source and second base regions,
an ohmic connection between said first portion of said second emitter region and said second power electrode, said ohmic connection having a resistance $R_2$, $R_2 \geq R_1/10$; and an insulated gate electrode disposed on said second major surface and extending from said source region to said second base region across said channel portion of said second emitter region for controlling the conduction of one type conductivity carriers through said channel portion of said second emitter region between said source region and said second base region.

39. A multicellular MOS controlled thyristor comprising:

first and second power electrodes;

a body of semiconductor material having first and second opposed major surfaces, said body including:

a first emitter region of one type conductivity extending to said first surface, a first base region of opposite type conductivity disposed adjacent to and forming a first PN junction with each of said segments of said first emitter region, a second base region of said one type conductivity disposed adjacent to and forming a second PN junction with said first base region, a second emitter region of said opposite type conductivity disposed adjacent to and forming a third PN junction with said second base region and extending to said second surface of said body and disposed in ohmic contact with said second power electrode and comprising a plurality of segments, a plurality of source region segments of said one type conductivity, each of said segments of said second emitter region having one of said source region segments disposed therein and forming a fourth PN junction therewith, each of said source region segments extending to said second surface of said body and disposed in ohmic contact with said second power electrode, each segment of said second emitter region including:

a first relatively high doping concentration portion, and a channel portion having a lower doping concentration, said channel portion being disposed adjacent to said second surface and extending between source region segment and said second base region, an insulated gate electrode disposed on said second major surface and extending from said source region segment to said second base region across said segment of said second emitter region for controlling conduction of one type conductivity carriers through said channel portion of said segment of said second emitter region between said segment of said source region and said second base region;

said second base region, said channel portion of each second emitter segment and said source region segment disposed therein comprising a segment of a turn-off FET, said segment of said turn-off FET exhibiting a first resistance $R_1$ between said second base region and said second power electrode; and an ohmic connection between each of said segments of said first portion of said second emitter region and said second power electrode, said ohmic connection between each of said segments of said second emitter region having a second resistance $R_2$, $R_2 \geq R_1/10$.

* * * * *